(12) United States Patent
Rivaud et al.

(10) Patent No.: US 11,703,649 B2
(45) Date of Patent: Jul. 18, 2023

(54) MODULAR NETWORKING HARDWARE PLATFORM

(71) Applicant: Ciena Corporation, Hanover, MD (US)

(72) Inventors: Daniel Rivaud, Ottawa (CA); Anthony Mayenburg, Carp (CA); Fabien Colton, Kars (CA); Nicola Benvenuti, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/839,619

(22) Filed: Jun. 14, 2022

(65) Prior Publication Data

US 2022/0308299 A1 Sep. 29, 2022

Related U.S. Application Data

(63) Continuation of application No. 16/778,041, filed on Jan. 31, 2020, now Pat. No. 11,372,180.

(51) Int. Cl.
*G02B 6/42* (2006.01)
*G02B 6/44* (2006.01)
(Continued)

(52) U.S. Cl.
CPC ......... *G02B 6/4277* (2013.01); *G02B 6/4292* (2013.01); *G02B 6/4432* (2013.01);
(Continued)

(58) Field of Classification Search
CPC .. G02B 6/3885; G02B 6/4277; G02B 6/4292; G02B 6/43; G02B 6/4432; G02B 6/4452;
(Continued)

(56) References Cited

U.S. PATENT DOCUMENTS

| | | | | |
|---|---|---|---|---|
| 5,701,596 A | * | 12/1997 | Meredith | H01Q 3/24 455/562.1 |
| 6,072,994 A | * | 6/2000 | Phillips | H04B 1/0003 455/280 |

(Continued)

FOREIGN PATENT DOCUMENTS

| | | | | |
|---|---|---|---|---|
| CN | 204290981 U | * | 4/2015 | H04B 17/10 |
| EP | 2253980 A1 | * | 11/2010 | G02B 6/4416 |

(Continued)

OTHER PUBLICATIONS

Copper Replacing Copper_Robert Hult_pp. 1-3_Jul. 2016.*
LGW2 Chapter 7, "Packet-Switching Networks," Network Services and Internal Network Operation, Spring 2013, pp. 1-153.

*Primary Examiner* — Timothy J Thompson
*Assistant Examiner* — Guillermo J Egoavil
(74) *Attorney, Agent, or Firm* — Clements Bernard Walker; Christopher L. Bernard

(57) ABSTRACT

A modular hardware platform utilizes a combination of different types of units that are pluggable into cassette endpoints. The present disclosure enables the construction of an extremely large system, e.g., 500 Tb/s+, as well as small, standalone systems using the same hardware units. This provides flexibility to build different systems with different slot pitches. The hardware platform includes various numbers of stackable units that mate with a cost-effective, hybrid Printed Circuit Board (PCB)/Twinax backplane, that is orthogonally oriented relative to the stackable units. In an embodiment, the hardware platform supports a range of 14.4 Tb/s-800 Tb/s+ in one or more 19" racks, providing full features Layer 3 to Layer 0 support, i.e., protocol support for both a transit core router and full feature edge router including Layer 2/Layer 3 Virtual Private Networks (VPNs), Dense Wave Division Multiplexed (DWDM) optics, and the like.

20 Claims, 20 Drawing Sheets

(51) Int. Cl.
*H01R 13/6592* (2011.01)
*H02M 7/00* (2006.01)
*H05K 7/14* (2006.01)
*H05K 7/20* (2006.01)

(52) U.S. Cl.
CPC ........ *H01R 13/6592* (2013.01); *H02M 7/003* (2013.01); *H05K 7/1425* (2013.01); *H05K 7/1438* (2013.01); *H05K 7/20572* (2013.01)

(58) Field of Classification Search
CPC ........ G02B 6/42; G02B 6/44; H01R 13/6592; H02M 7/003; H02M 7/00; H05K 7/1425; H05K 7/1438; H05K 7/1492; H05K 7/20572; H05K 7/14; H05K 7/20
USPC ....... 361/222, 800, 679.5, 727, 679.48, 690, 361/695, 694; 312/236; 454/184
See application file for complete search history.

(56) References Cited

U.S. PATENT DOCUMENTS

| | | |
|---|---|---|
| 6,546,181 B1 | 4/2003 | Adapathya et al. |
| 7,535,893 B1 | 5/2009 | Beladakere et al. |
| 8,154,867 B2 | 4/2012 | Shearman et al. |
| 8,630,087 B1 * | 1/2014 | Reynov .................. G06F 1/181 361/679.5 |
| 9,203,782 B2 | 12/2015 | Mayenburg et al. |
| 9,603,289 B1 | 3/2017 | Shearman et al. |
| 9,820,403 B2 | 11/2017 | Shearman et al. |
| 10,012,811 B2 | 7/2018 | Rivaud et al. |
| 10,247,895 B2 | 4/2019 | Rivaud et al. |
| 10,425,360 B2 | 9/2019 | Estabrooks et al. |
| 10,795,096 B1 * | 10/2020 | Leigh ................... G02B 6/3883 |
| 2005/0050272 A1 * | 3/2005 | Behrens .................... G06F 1/18 711/114 |
| 2008/0239771 A1 * | 10/2008 | Wang ..................... H02M 1/12 363/44 |
| 2010/0321898 A1 * | 12/2010 | Tzeng ................ H05K 7/20445 361/721 |
| 2016/0128221 A1 | 5/2016 | Butterbaugh et al. |
| 2016/0234962 A1 * | 8/2016 | Shinsato .............. G11B 33/128 |
| 2017/0105060 A1 | 4/2017 | Oltman et al. |
| 2017/0118862 A1 * | 4/2017 | Eberle, Jr. ............ A47B 88/407 |
| 2017/0126289 A1 * | 5/2017 | Fischer .................... H04J 3/00 |
| 2018/0076515 A1 * | 3/2018 | Perlman .................. H04B 1/38 |
| 2018/0335595 A1 * | 11/2018 | Takeuchi ............... G02B 6/445 |
| 2019/0073006 A1 * | 3/2019 | Chang ..................... G06F 1/26 |
| 2019/0204800 A1 * | 7/2019 | Leung ..................... H02J 4/00 |
| 2019/0327188 A1 | 10/2019 | Rivaud et al. |
| 2019/0357380 A1 | 11/2019 | Preuss et al. |
| 2020/0329286 A1 * | 10/2020 | Rose ..................... H05K 7/186 |

FOREIGN PATENT DOCUMENTS

| | | | | |
|---|---|---|---|---|
| WO | 2018102416 A1 | 6/2018 | | |
| WO | 2019128448 A1 | 7/2019 | | |
| WO | WO-2019128448 A1 * | 7/2019 | ............ | H01R 12/75 |
| WO | 2020091690 A1 | 5/2020 | | |

* cited by examiner

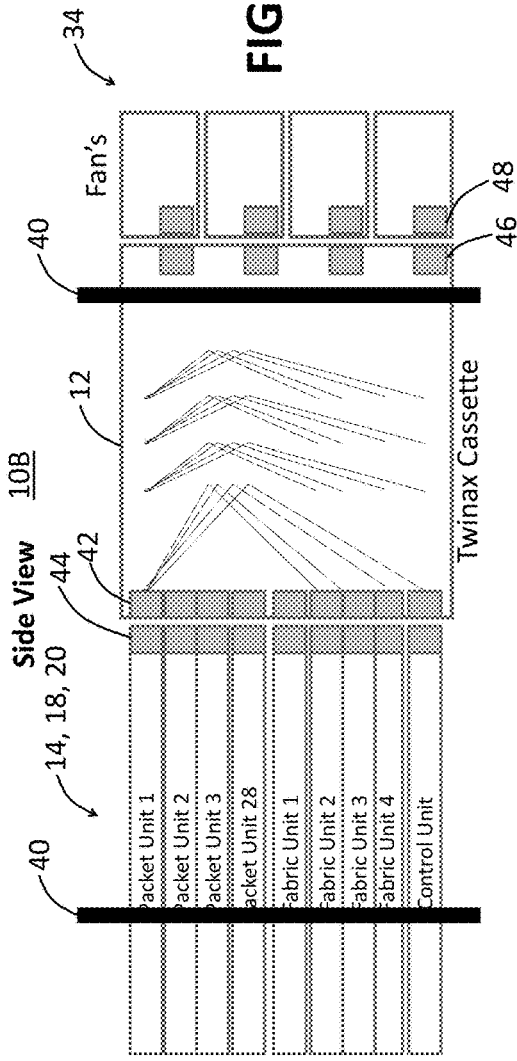
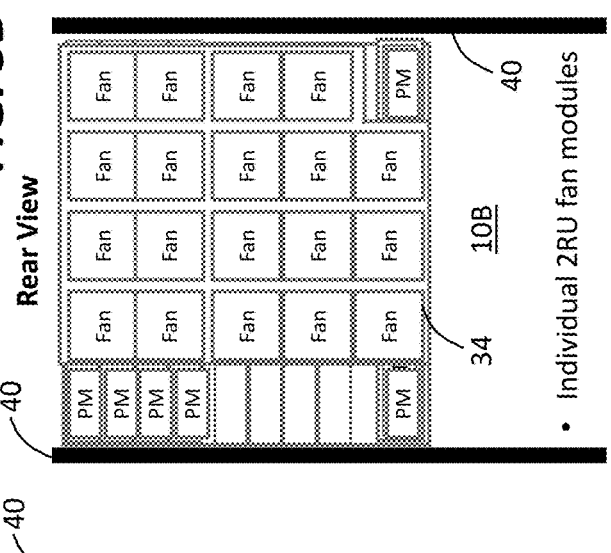
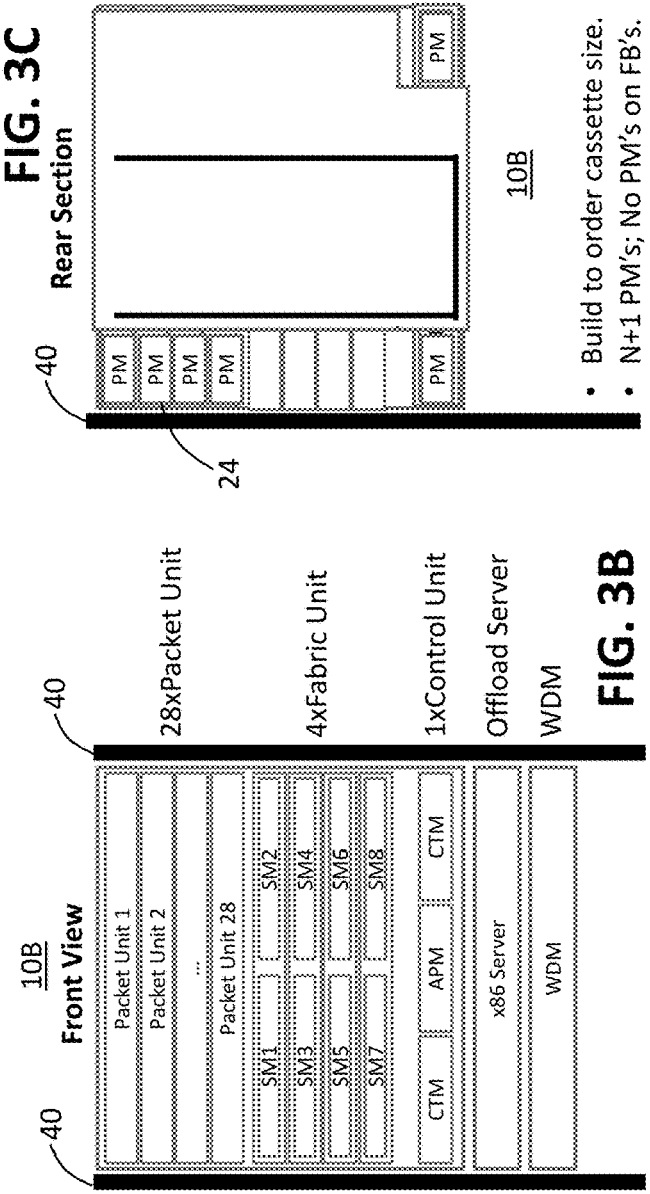

Rear Sections

Side View

Front View

FIG. 8

Solution Continuum & Trade-offs...

Ortho-direct Chassis ↔ Hardware Platform 10 ↔ Leaf-spine pizza boxes

| | Ortho-direct chassis | Hardware Platform 10 | Leaf-spine pizza boxes |
|---|---|---|---|
| Fabric Connectivity | Hybrid PCB (short links) + Twinax (long links) | Hybrid PCB (short links) + Twinax (long links) | Ethernet fabric QSFP AOC's |
| Rear-access modules | Fabric Modules, Fans. | Fans | PM's, fans. |
| System Depth for 500T size | >1000mm | 700 mm | 600mm |
| Vertical expansion within 1 rack | Need couplers to join FM's beyond 20RU. | Limited only by rack height. | Limited only by rack height. |
| Repeaterless multi-rack expansion | More challenging at rear with cables blocking FM access. | Yes (multi-rack cassette) | Yes (AOC's) |
| Max system size | 288T without couplers or repeaters. | >575T multi-rack. | >1000T |
| Air Cooled @ 50C | Not likely -- Fabric Modules receive pre-heated air from Line Modules. | More likely -- Every module gets its own fresh air intake. | Yes -- pizza box can have whatever size fans and air intake it needs. |
| Air Cooled @ 40C | Yes, but less margin for future additions. | Yes. | Yes. |
| Build-to-order system size; only passive components change. | No -- Unique Fabric Module per size. | Yes -- Only backplane cassette changes. | Yes -- re-distribute AOC cables. |
| Interconnect Cost | OK (some twinax + some AOC's). | Good (twinax). | Bad (AOC's). |
| 112Gbps/lane support | Yes | Yes | Yes |
| Bufferless fabric with backpressure | Yes -- BCM DUNE VOQ | Yes -- BCM DUNE VOQ | Industry still trying to solve. |
| Operations complexity | Simple | Simple | Lots of cable management & debug |
| Faceplate client density | Good. | Good. | Half -- faceplate used for fabric connectivity. |
| Acoustic Noise | Fan size decoupled from active module sizes. | Fan size decoupled from active module sizes. | Fan size coupled to pizza box size -- 1RU box requires loud 1RU fans. |
| SW complexity | Low | Low | High -- Manage each pizza box. |

120

122 — installing a cassette system in a rack, wherein the cassette system includes one or more units each having cabling therein and a first plurality of connectors located along the length, wherein the cabling, in each unit of the cassette system, extends between each of the first plurality of connectors for interconnectivity between each corresponding connector along the length of the corresponding unit of the cassette system 124 — connecting a plurality of units to the cassette system, wherein each of the plurality of units has a second plurality of connectors on a rear side configured to connect to corresponding connectors of the first plurality of connectors, wherein an orientation of the plurality of units is orthogonal to an orientation of the one or more units, wherein each of the plurality of units is any of a packet unit, a fabric unit, and a control unit, and wherein collectively the plurality of units are configured to operate as a network element in a network

FIG. 20

MODULAR NETWORKING HARDWARE PLATFORM

CROSS-REFERENCE TO RELATED APPLICATION(S)

The present disclosure is a continuation of U.S. patent application Ser. No. 16/778,041, filed Jan. 31, 2020, the contents of which are incorporated by reference in their entirety.

FIELD OF THE DISCLOSURE

The present disclosure generally relates to networking hardware. More particularly, the present disclosure relates to a modular networking hardware platform.

BACKGROUND OF THE DISCLOSURE

Networks, data centers, cloud infrastructure, etc. are realized ultimately through physical hardware. The physical hardware is used to realize networking, computing, and/or storage functions, including optical/photonic networking, Time Division Multiplexing (TDM), packet switching, etc. Conventionally, there are generally two approaches for how physical hardware is deployed—through a chassis and associated modules or through a rack mounted unit. A chassis-based system includes a chassis with multiple slots and a backplane that support different modules, line cards, circuit packs, blades, etc. (for simplicity, these are referred to as modules). The chassis-based system allows deployment flexibility where modules as-needed or required are selectively inserted in the chassis. The chassis includes an electrical (Printed Circuit Board (PCB)) backplane, fixed-size modules, shared power and cooling for all of the modules, a central switch fabric such as through one or more modules, etc. Other advantages of a chassis include power installation once for the chassis, front access only, redundancy, tight coupling of software and hardware, etc.

There are several fundamental challenges, namely 1) PCB backplanes are becoming limited in their ability to support higher Serializing-Deserializer (SERDES) rates at the same Fabric-to-Module distances, 2) the industry business model that led to these types of designs is changing, 3) consumption patterns on life-cycle and depreciation practiced by network operators, that is in turn reinforced by the merchant Application Specific Integrated Circuit (ASIC) supply chain, connote requirements for greater modularity, and the like. That is, the conventional chassis-based approach is centralized with a fixed form-factor, which limits flexibility in size, power, and the ability to address different applications. Further, the chassis-based approach requires a lock-in ahead of time, suboptimal faceplate use, fixed slot sizes, and power, fixed cooling, fixed slot bandwidth, etc. The chassis-based approach requires a large initial investment.

The rack mounted unit is also referred to as "pizza boxes" and generally includes 1-2 (or more) Rack Unit (RU or simply U and which is a standard unit of measurement of 44.5 mm or 1.75") high completely enclosed form factor. The rack mounted unit differs from a chassis in that all of the hardware is already included as the rack mounted unit is deployed. For example, data centers realize network elements such as in a leaf/spine architecture in a completely decentralized and modular form using rack mounted units. Advantages of the rack mounted unit approach include standard interfaces, stackability, low cost, adaptability, low first-in cost, and pay as you go, etc. While this provides flexibility, this approach has interconnect complexity, such as massive amounts of cabling in the front and this cabling is based on pluggable optics that lack the density achievable in the chassis-based approach. Also, this approach does not include redundancy, expansion to larger systems is complex and inefficient, and each install requires a power connection.

An example solution to the above-referenced limitations is described in commonly assigned U.S. patent application Ser. No. 15/959,746, filed Apr. 23, 2018, and entitled "Modular network element architecture," the contents of which are incorporated herein by reference.

BRIEF SUMMARY OF THE DISCLOSURE

The present disclosure relates to a modular networking hardware platform. The hardware platform utilizes a combination of different types of units that are pluggable into cassette endpoints. An aspect of the present disclosure includes the construction of an extremely large system, e.g., 500 Tb/s+, as well as small, standalone systems using the same hardware units. This provides flexibility to build different systems with different slot pitches. The hardware platform includes various numbers of stackable units that mate with a cost-effective, hybrid PCB/Twinax backplane, that is orthogonally oriented relative to the stackable units. In an embodiment, the hardware platform supports a range of 14.4 Tb/s-800 Tb/s+ in one or more 19" racks, providing full features Layer 3 to Layer 0 support, i.e., protocol support for both a transit core router and full feature edge router including Layer 2/Layer 3 Virtual Private Networks (VPNs), Dense Wave Division Multiplexed (DWDM) optics, and the like.

In an embodiment, a networking hardware platform includes a plurality of units each having a first plurality of connectors on a rear side, wherein each of the plurality of units is any of a packet unit, a fabric unit, and a control unit, and wherein collectively the first plurality of units are configured to operate as a network element in a network; and a cassette system including a one or more units each having cabling therein and a second plurality of connectors located along the length to connect to corresponding connectors of the first plurality of connectors, wherein the cassette system is configured to connect to a rack, and wherein an orientation of the one or more units is orthogonal to an orientation of the plurality of units, in the rack, wherein the cabling, in each of the one or more units, extends between each of the second plurality of connectors for interconnectivity with corresponding connector along the length of the corresponding one or more units. The cabling can include a plurality of Twinaxial cables. The second plurality of connectors can be further configured to connect to corresponding connectors in a second rack, such that the network element includes the plurality of units in the rack and in the second rack. The networking hardware platform can further include a second control unit located in the second rack connected to a first control unit located in the rack.

The cabling can include optical cabling with a multi-fiber connector forming the first plurality of connectors and the second plurality of connectors. The networking hardware platform can further include one or more fans disposed at an opposite end of the one or more units from the plurality of units. The one or more units can include multiple units that form channels for airflow between the plurality of units and the fans and for electromagnetic interference (EMI) containment. Each of the plurality of units can be in a different plane from one another and airflow is front-to-back from a faceplate of each unit to corresponding one or more fans.

The one or more units can be each a passive device and includes a read-only memory for identification thereof. A depth of the one or more units can be based on how much interconnect is required for the plurality of units. A pitch of at least two units of the plurality of units can be different. The packet units can be configured to support pluggable optical modules. The networking hardware platform can further include at least one universal unit that is similar functionally to the packet unit except for larger pitch and for support of at least one coherent optical module for long haul transmission. The networking hardware platform can further include N+1 power modules located at a rear of the one or more units, N is an integer ≥1 and the +1 is a protection module. The N+1 power modules can provide substantially 380 VDC to the units.

In another embodiment, a method of installing a networking hardware platform includes installing a cassette system in a rack, wherein the cassette system includes one or more units each having cabling therein and a first plurality of connectors located along the length, wherein the cabling, in each unit of the cassette system, extends between each of the first plurality of connectors for interconnectivity between each corresponding connector along the length of the corresponding unit of the cassette system; and connecting a plurality of units to the cassette system, wherein each of the plurality of units has a second plurality of connectors on a rear side configured to connect to corresponding connectors of the first plurality of connectors, wherein an orientation of the plurality of units is orthogonal to an orientation of the one or more units, wherein each of the plurality of units is any of a packet unit, a fabric unit, and a control unit, and wherein collectively the plurality of units are configured to operate as a network element in a network. The cabling can include a plurality of Twinaxial cables. The method can further include connecting the first plurality of connectors associated with the cassette system to corresponding connectors in a second rack, such that the network element includes the plurality of units in the rack and in the second rack.

In a further embodiment, a networking hardware interconnection system includes one or more units that are configured to connect to a rack; and cabling in each of the one or more units between a first plurality of connectors located along the length, wherein the first plurality of connectors are configured to connect to corresponding connectors of a second plurality of connectors of a plurality of units that are orientated orthogonal to the one or more units, and wherein the one or more units form channels for airflow between the plurality of units and fans and for electromagnetic interference (EMI) containment. The cabling can include a plurality of Twinaxial cables.

BRIEF DESCRIPTION OF THE DRAWINGS

The present disclosure is illustrated and described herein with reference to the various drawings, in which like reference numbers are used to denote like system components/method steps, as appropriate, and in which:

FIGS. 3A-3D are diagrams of a single rack hardware platform 10 where FIG. 3A is a side view, FIG. 3B is a front view, FIG. 3C is a rear section view, and FIG. 3D is a rear view;

FIG. 8 is a table illustrating different approaches for networking hardware to compare the hardware platform of the present disclosure with the chassis of FIGS. 6-7 and pizza boxes;

FIG. 20 is a flowchart of a process of installing a networking hardware platform.

DETAILED DESCRIPTION OF THE DISCLOSURE

Again, the present disclosure relates to a modular networking hardware platform. The hardware platform utilizes a combination of different types of units that are pluggable into cassette endpoints. An aspect of the present disclosure includes the construction of an extremely large system, e.g., 500 Tb/s+, as well as small, standalone systems using the same hardware units. This provides flexibility to build different systems with different slot pitches. The hardware platform includes various numbers of stackable units that mate with a cost-effective, hybrid PCB/Twinax backplane, that is orthogonally oriented relative to the stackable units. In an embodiment, the hardware platform supports a range of 14.4 Tb/s-800 Tb/s+ in one or more 19" racks, providing full features Layer 3 to Layer 0 support, i.e., protocol support for both a transit core router and full feature edge router including Layer 2/Layer 3 Virtual Private Networks (VPNs), Dense Wave Division Multiplexed (DWDM) optics, and the like.

Variously, the hardware platform includes the stackable units that mate with cassette endpoints.

The following acronyms are utilized herein

| Acronym | Phrase |
|---|---|
| AOC | Active Optical Cable |
| BFD | Bidirectional Forwarding Detection |
| BGP | Border Gateway Protocol |
| CE | Customer Edge |
| CP | Control Plane |
| CPU | Central Processing Unit |
| FEC | Forwarding Equivalence Class |
| FDB | Forwarding Database |
| FIB | Forwarding Information Base |
| GE | Gigabit Ethernet |
| ICMP | Internet Control Message Protocol |
| IGP | Interior Gateway Protocol |
| IP | Internet Protocol |
| ISIS | Intermediate System-Intermediate System |
| LDP | Label Distribution Protocol |
| MAC | Medium Access Control |
| MPLS | Multi-Protocol Label Switching |
| MSE | Multi-Service Edge |
| NGROADM | Next Generation ROADM |
| NIC | Network Interface Card |
| NNI | Network-Network Interface |
| OAM | Operations, Administration and Maintenance |
| OSS | Operations Support System |
| OTN | Optical Transport Network |
| PCE | Path Computation Element |
| PCEP | PCE Protocol |
| PE | Provider Edge |
| PIM | Protocol Independent Multicast |
| PIP | Private IP |
| PS | Packet Switching |
| PW | Pseudo Wire |
| QoS | Quality of Service |
| QSFP | Quad Small Form factor Pluggable |
| RAM | Random Access Memory |
| RI | Router Instance |
| RIB | Routing Information Base |
| ROADM | Reconfigurable Add Drop Multiplexer |
| RSVP | Resource reSerVation Protocol |
| SDN | Software-Defined Network |
| SES | Switched Ethernet Service |
| TDM | Time Division Multiplexing |
| TE | Traffic Engineering |
| UNI | User-Network Interface |
| VPN | Virtual Private Network |

Platform and Components

Figure 1:
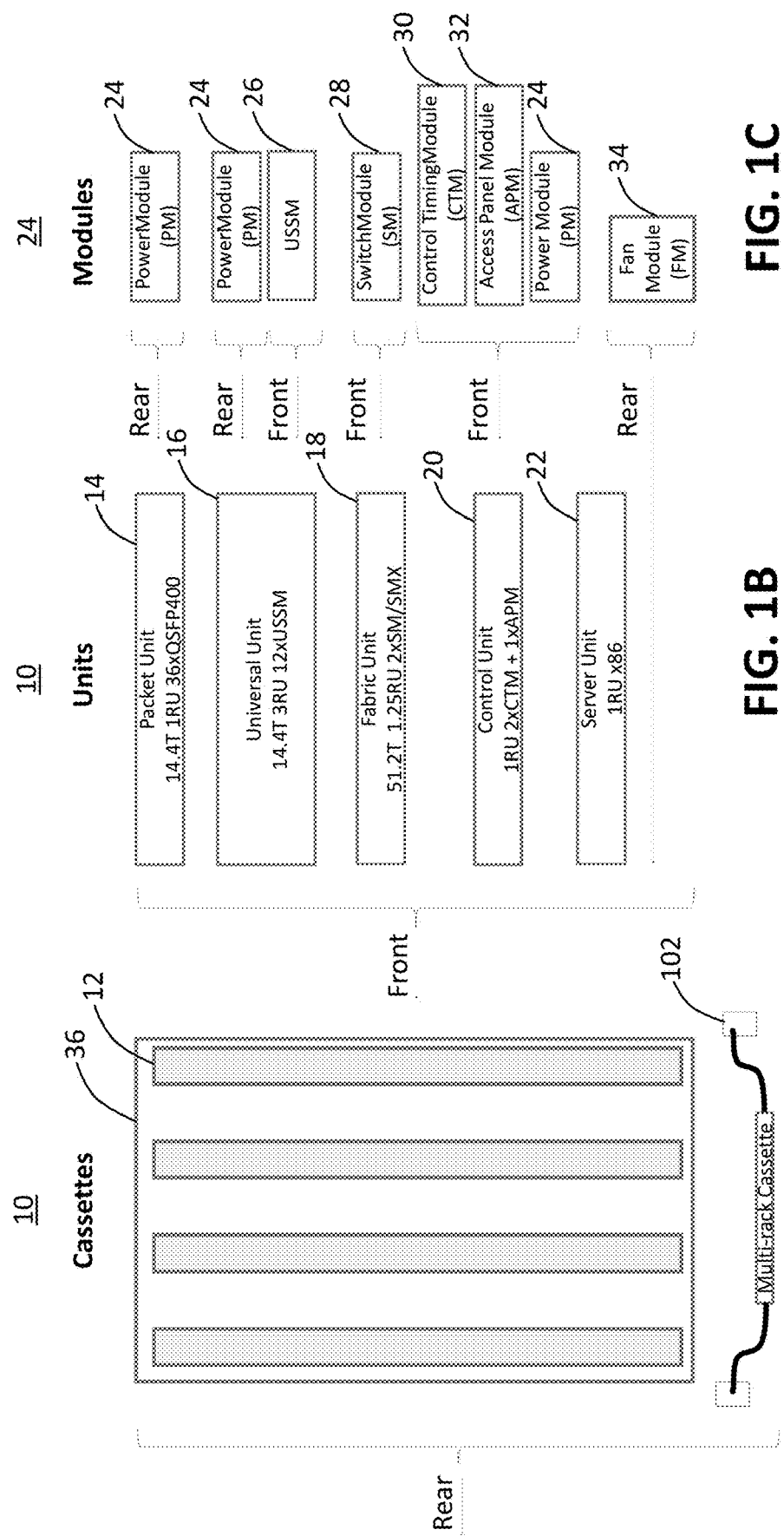
FIGS. 1A, 1B, and 1C are block diagrams of a networking hardware platform with FIG. 1A illustrating a rear view of a rack with cassettes, FIG. 1B illustrating a front view of stackable horizontal units, and FIG. 1C illustrating modules that plug into either a front or a rear of the units.

FIGS. 1A, 1B, and 1C are block diagrams of a networking hardware platform 10 with FIG. 1A illustrating a rear view of a rack with cassettes 12, FIG. 1B illustrating a front view of stackable horizontal units 14, 16, 18, 20, 22, and FIG. 1C illustrating modules 24-34 that plug into either a front or a rear of the units 14, 16, 18, 20, 22. The stackable horizontal units 14, 16, 18, 20, 22 include a packet unit 14, a universal unit 16, a fabric unit 18, a control unit 20, and a server unit 22. Each of the stackable horizontal units 14, 16, 18, 20, 22 can be a rack-mounted unit with connectors (not shown in FIG. 1) for mating with the cassettes 12. Those of ordinary skill in the art are familiar with chassis and associated modules as well as with rack-mounted units ("pizza boxes"). The stackable horizontal units 14, 16, 18, 20, 22 are a hybrid implementation relative to the chassis with modules and the stand-alone pizza boxes. Further, those of ordinary skill in the art will appreciate the horizontal units 14, 16, 18, 20, 22 are presented for illustration purposes, and other types of units are also contemplated and expected due to the modular nature of the hardware platform 10. Also, as described herein, element 12 is referred to as a cassette 12 and one or more cassettes 12 can be referred to as a cassette system. Further, the cassette system can include one or more units, each unit being a single cassette 12. Such a unit includes a housing, cabling, and connectors.

Of note, the terms "horizontal" and "vertical" may be used herein for illustration purposes. The stackable horizontal units 14, 16, 18, 20, 22 are shown as horizontally oriented whereas the cassettes are shown as vertically orientated. Those of ordinary skill in the art will appreciate the stackable horizontal units 14, 16, 18, 20, 22 could be vertically oriented whereas the cassettes 12 could then be horizontally oriented. That is, the orientation of the cassettes 12 and the orientation of the units 14, 16, 18, 20, 22 are orthogonal to one another, and the reference to stackable horizontal units 14, 16, 18, 20, 22 is merely for illustration of an example embodiment.

The modules 24-34 include includes a power module 24, a Universal Sub Slot Module (USSM) 26, a switch module 28, a control and timing module 30, an access panel module 32, and a fan module 34. The power module 24 can provide power connectivity. The USSM 26 can be a standardized pluggable interface for various types of pluggable modules include coherent optics modules and the like. The switch module 28 can be a packet switch. The control and timing module 30 can provide Operations, Administration, and Maintenance (OAM) functions. The access panel module 32 can provide management interfaces (e.g., Ethernet, etc.). The fan module 34 can provide cooling.

The packet unit 14 can include various ports, such as UNI/NNI 400GE/200GE/100GE interface ports. In an embodiment, the packet unit 14 can be 1RU, including 36× QSFP4DD modules on the faceplate (14.4 Tb/s capacity and processing circuitry (x86+FPGA accelerator) for local control and OAM functions. The packet units 14 can perform packet processing functions such as, for example, FIB/FDB operations, queuing/policing, access-control filtering/lists, control plane offload functions (e.g., telemetry/OAM/BFD/ etc.). The packet units 14 can include packet processing circuitry.

The universal unit 16 can have the same packet processing circuitry as the packet unit 14 but support the USSM 26 to add coherent optical interfaces and/or unique capabilities such as circuit emulation of OTN/Ethernet over a packet fabric/network. The USSM 26 is a pluggable module, specified by Ciena Corporation, and described, for example, in commonly assigned U.S. patent application Ser. No. 16/391, 642, filed Apr. 23, 2019, and entitled "Universal sub slot architecture for networking modules," the contents of which are incorporated herein by reference. For example, the universal unit 16 has a larger footprint (3RU) relative to the packet unit 14 (1RU) and can support up to 12 USSMs 26. The universal unit 16 still utilizes the same forwarding chipsets as the packet unit 14. In order to maximize the forwarding capabilities of the forwarding plane, the pitch of the universal unit 16 will be 3RU as DWDM line interfaces cannot be packed as densely within an assembly as regular client optics can, in the packet unit 14.

The USSMs 26 allow for more interface and service flexibility, relative to standard pluggable modules such as QSFP4DD. For example, the USSM 26 can be an OTN/ Ethernet module for circuit emulation of OTN/Ethernet over a packet fabric/network with 8xQSFP28 (of which 2 ports are QSFP-DD), with support for Flexible Ethernet (FlexE) if needed. The USSM 26 can also be an integrated DWDM line interface, such as 2×200-800 Gb/s modems, including 600G ULH, 4xCFP2-DCO modems (4×400G ZR++ capable), etc.

The fabric unit 18 provides interconnect between packet units 14 and universal units 16. In an embodiment, the fabric unit 18 is a 1.25RU size and includes two switch modules 28.

The control unit 20 is a network element controller and can be based on an x86. The control unit 20 performs all aspects of system control plane functions, including (but not limited to) Configuration Management functions, Northbound (OSS) interfaces (Alarms, Telemetry, Provisioning), Routing Protocol control plane functions, and the like.

The server unit 22 is capable of performing any general processing for various use cases and can connect directly to the backplane via the control and timing module 30. The server units 22 allow for additional compute capacity to be provided to the system in a modular fashion and allow for independent software delivery. The server unit 22 can be utilized to implement Virtualized Network Functions (VNFs), such as, for example, Route Reflectors; Mapping Servers; OTN control plane for legacy interworking; Telemetry monitoring, aggregation, and analytics; Localized VNF, example: Nodal Health and Service Assurance; and the like.

The hardware platform 10 includes a backplane 36 that includes a variable size passive metal cassette 12 that provides connectivity between the horizontal units 14, 16, 18, 20, 22. In an embodiment, the backplane 36 and the cassettes 12 utilize Twinaxial cabling (also referred to as "Twinax"). Twinax is a type of cable similar to coaxial cable, but with two inner conductors instead of one. Due to cost efficiency, it is becoming common in very-short-range high-speed differential signaling applications. Twinax has 0.2 dB/inch insertion loss relative to 1.0 dB/in for a reasonably high-end PCB material like Meg7N+. So Twinax can have lengths 5× longer than non-exotic PCB material, which enables larger system sizes.

Figure 2:
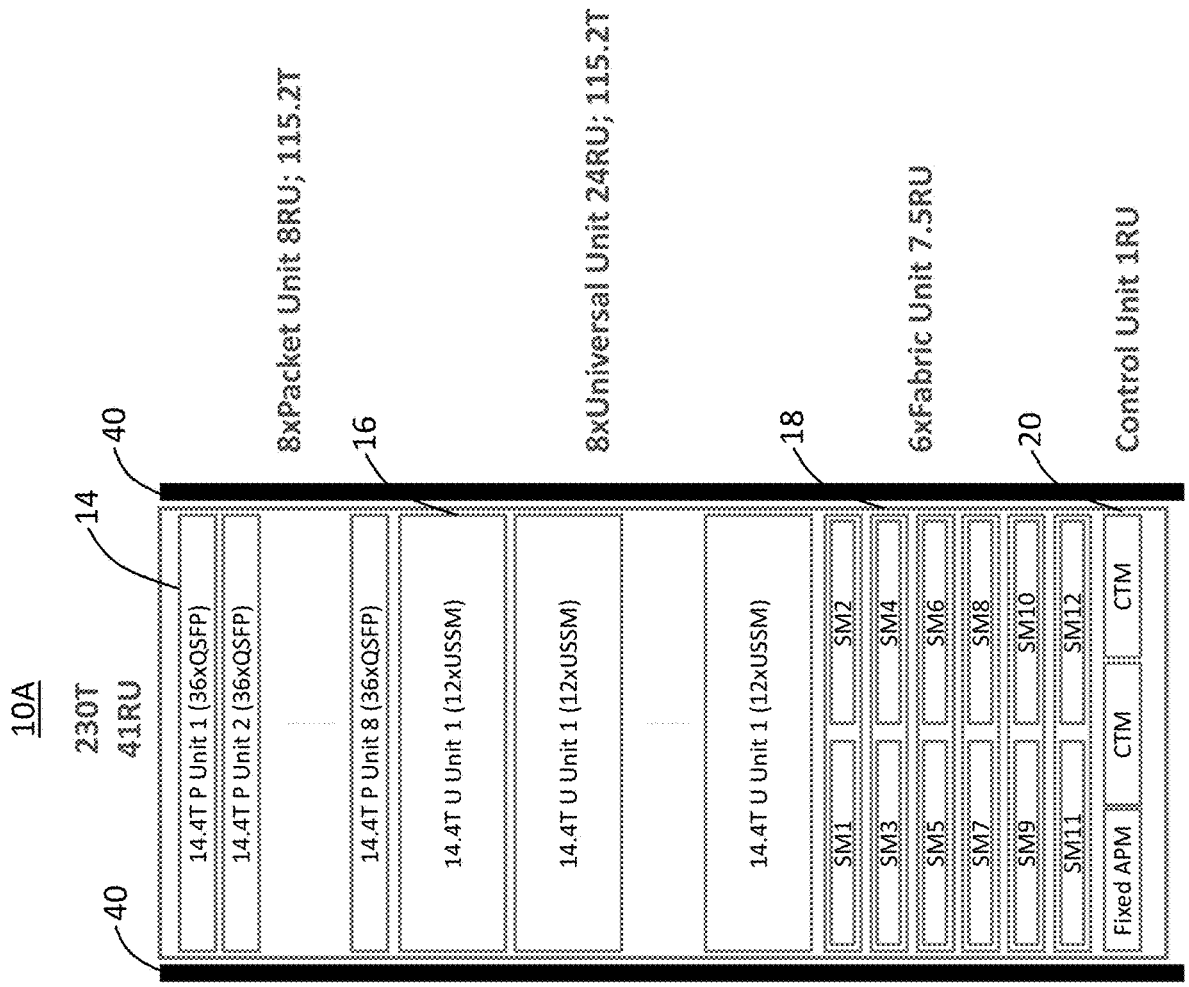
FIG. 2 is a block diagram of a front view of an example hardware platform supporting 230 Tb/s in a single rack.

FIG. 2 is a block diagram of a front view of an example hardware platform 10A supporting 230 Tb/s in a single rack. The hardware platform 10A is presented for illustration purposes, and those of ordinary skill in the art will recognize various different configurations are possible given the modular nature of the hardware platform 10. FIG. 2 is a front view illustrating rack posts 40 and the associated units 14, 16, 18, 20. In this example, there are 8 packet units 14 with 8×36 QSFPs and 8 universal units 16 with 8×12 USSMs 26. These units 14, 16 are interconnected by the 6 fabric units 18 equipped with 12 switch modules 28. For example, the 8 packet units 14 can provide local client interconnect while the 8 universal units 16 can provide remote client interconnect via DWDM.

FIGS. 3A-3D are diagrams of a single rack hardware platform 10B where FIG. 3A is a side view, FIG. 3B is a front view, FIG. 3C is a rear section view, and FIG. 3D is a rear view. In this example, the hardware platform 10B includes 28 packet units 14 that are interconnected to one another via 4 fabric units 18. Those of ordinary skill in the art recognize a typical telecom rack can have four posts 40. In FIG. 3A, the side view illustrates the two posts 40 on one side and, in FIGS. 3B-3D, the front and rear views illustrate the posts 40 on opposite sides. In FIG. 3A, it is noted the units 14, 18, 20 take about half the depth of the rack. The cassette 12 can have a variable depth depending on how much interconnect is necessary, i.e., the Twinax cabling expands based on how much interconnectivity is required. For example, the following provides some examples of the overall depth of the hardware platform 10 based on the size of the system and the corresponding size of the cassettes 12—

| | |
|---|---|
| Extra-Large systems (400 Tb/s) | 900 mm |
| Large system (100 Tb/s-200 Tb/s) | 800 mm |
| Medium system (28.8 Tb/s-100 Tb/s) | 700 mm |
| Small, fabric-less system (14.4 Tb/s) | 600 mm |

For example, a small fabric-less system may include a single packet unit 14 with no corresponding cassette 12. The cassettes 12 include connectors 42 that mate mechanically with connectors 44 associated with the units 14, 16, 18, 20. The cassettes 12 can include connectors 46 that mate with connectors 48 on the fan modules 34.

FIG. 3C illustrates a rear sectional view of the hardware platform 10B with power modules 24 (PM) installed on the packet units 14 and the control unit 20. There are no power modules 24 on the fabric units 18. The cassettes 12 are built to order as described herein. FIG. 3D illustrates a rear view illustrating the 2RU fan modules 34.

Figure 3E:
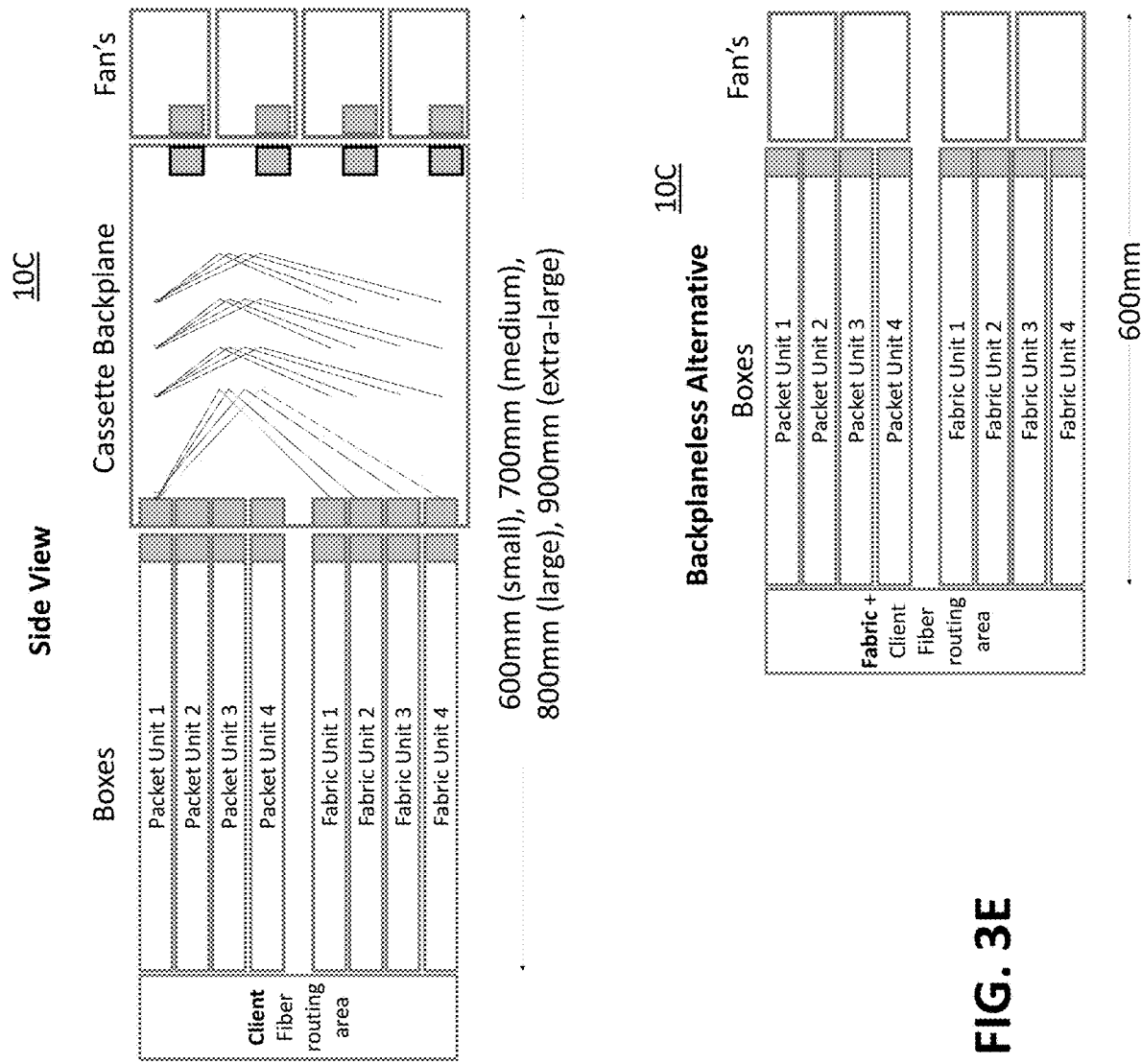
FIG. 3E is a block diagram of a hardware platform in a side view to compare a cassette backplane with a backplaneless embodiment.

FIG. 3E is a block diagram of a hardware platform 10C in a side view to compare a cassette backplane 12 with a backplane-less embodiment. Here, a smaller system with the packet units 14 and the fabric units 18 can be implemented without the cassettes 12 to fit within 600 mm depth. In lieu of the cassettes 12, the hardware platform 10C utilizes faceplate AOC cabling.

Platform Software Features

The hardware platform 10 supports a full suite of routing protocols/services expected of a next-generation transit core IP platform—including feature-rich support for ISIS, BGP, and Segment Routing. Also, as the trend continues towards extending content/peering/compute capacity closer to the user, it is expected that the Service Edge infrastructure will remain the focal point for high density edge services and peering functions, allowing the core to be optimized for transport scale/capacity. While it is assumed that the core routers will not replace existing edge routers (e.g., MSE, Peering Router, etc.), the hardware platform 10 also supports L2/L3 services for locations where a service provider could optimize footprint. Though inter-working may be required between the legacy core and the new network, BGP, ISIS, and Segment Routing will form the main infrastructure elements of the network, and legacy interoperability is performed on a case-by-case basis. Particularly, where legacy OTN services are required, the hardware platform 10 implements OTN/Ethernet-emulation over its packet forwarding infrastructure (using a specific USSM 26 variant). This will also provide service providers the flexibility to carry legacy service types over their next-generation network.

Platform Building Block Re-Use

Most of the active components associated with the hardware platform 10 are shared across markets and applications. This allows the high-volume access market to drive lower cost for the code market with the following shared components: the fabric units 18, the switch modules 28, the power modules 24, the control and timing module 30, and the fan modules 34. That is, the reuse of these common modules allows cost savings/sharing.

The power modules 24 have dual input feeds to support an A+B input feed scenario and an N+1 load sharing of power modules onto a single internal C-feed to minimize the feed requirements that are then distributed on the virtual backplane to all components of the hardware platform 10. There can be separate modules for AC and DC. The fan modules 34 can have dual-rotors that provide higher fault tolerance with redundant power feeds and independent controls. Fan speed control is a closed-loop system with ambient temperature being utilized to determine the maximum fan speed and internal component temperatures utilized to slow down fans to maintain optimal component temperatures and minimize unnecessary power consumption and noise.

Variable Fabric Size

Figure 4:
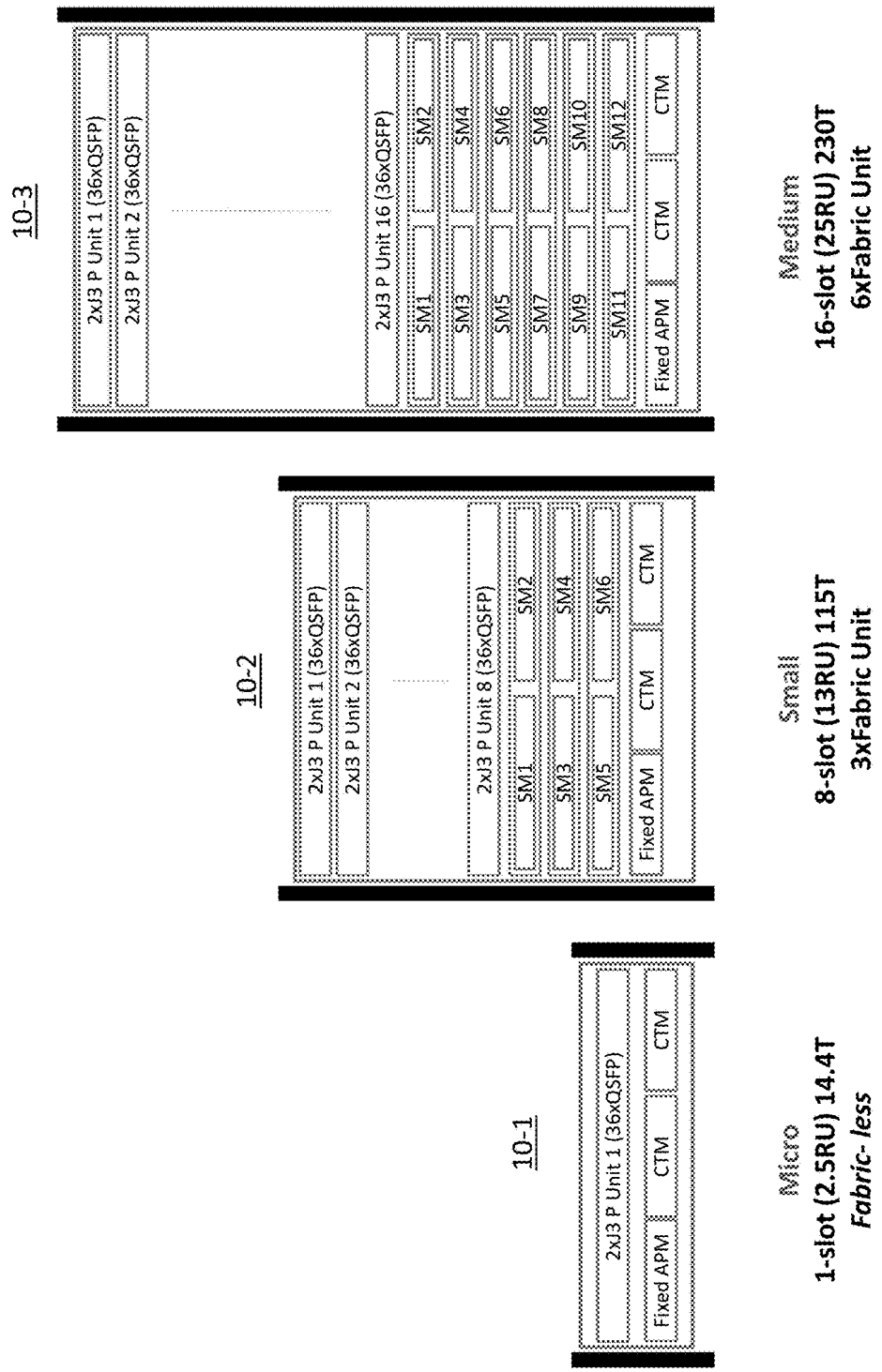
FIG. 4 is a block diagram of a front view of single rack illustrating hardware platforms of varying sizes.

FIG. 4 is a block diagram of a front view of a single rack illustrating hardware platforms 10-1, 10-2, 10-3 of varying sizes. An aspect of the approach for the hardware platform 10 is that each system size has the number of fabric units 16 that it needs (e.g., 3, 4, or 12 switch modules 28 per system). An example of the variable size is shown in FIG. 4. There is no minimum number of fabric units 16. There can be zero fabric units 16 to realize a very cost-effective and compact direct mesh at 14.4 Tb/s. Within a single market or application, each system size is differentiated only by the passive components. That makes it easier to create more unique sizes to fit the service provider's needs without oversizing any given node.

Multi-Rack Configuration

Figure 5:
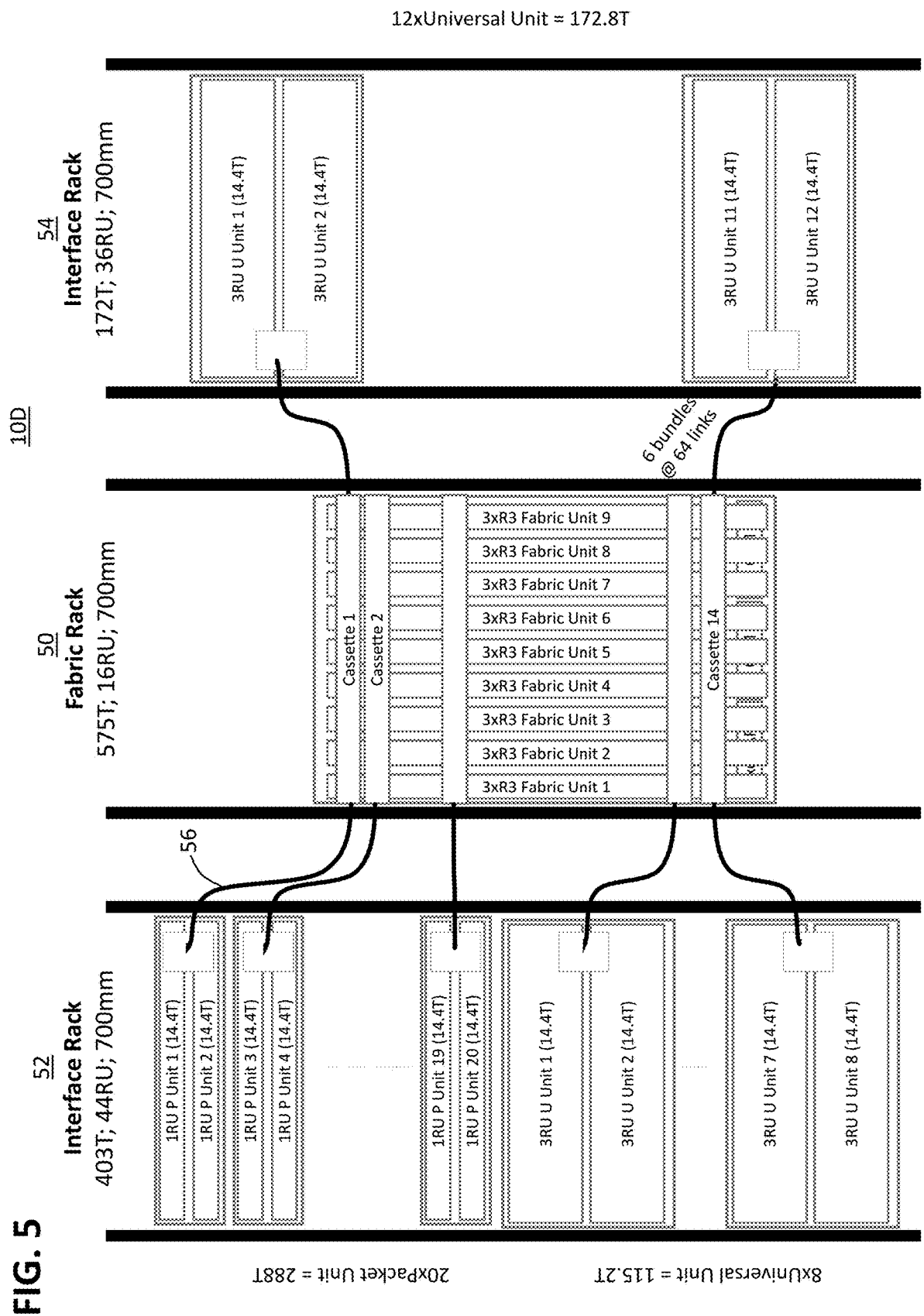
FIG. 5 is a block diagram of a front view of three racks illustrating a multi-rack configuration for a hardware platform.
Figure 6C:
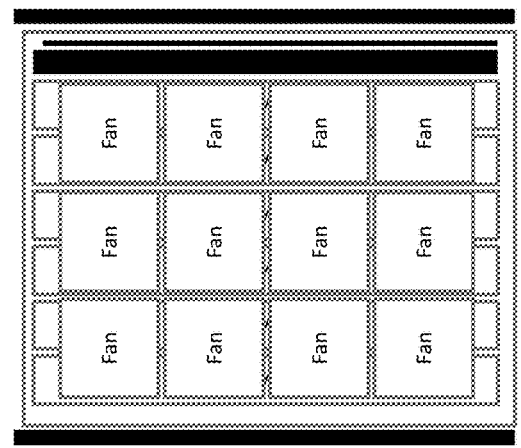
FIGS. 6A-6D are block diagrams of an ortho-direct approach for a chassis, for comparison with the hardware platform.
Figure 6D:
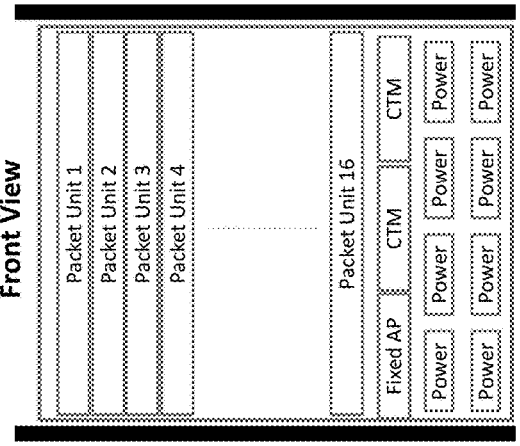
Figure 6A:
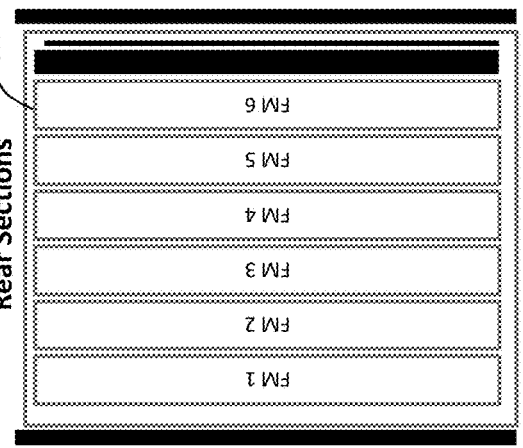
Figure 6B:
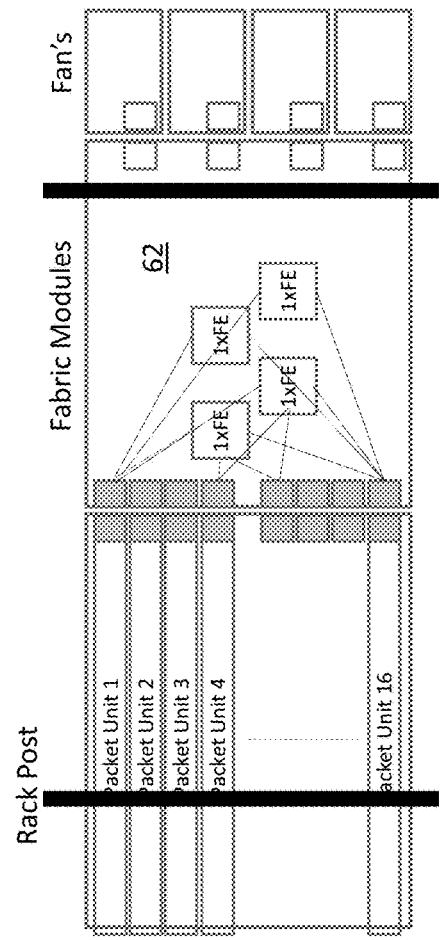

FIG. 5 is a block diagram of a front view of three racks illustrating a multi-rack configuration for a hardware platform 10D. In the past, back-to-back chassis used optical interconnect, which had two issues, namely high cost and requirement for new active fabrics to be developed and tested. The hardware platform 10D achieves a single multi-rack node via an unfolded ortho structure that has vertical fabrics in a center rack 50 and horizontal interface units 14, 16, 18, 20 in two adjacent racks 52, 54. Of note, the center rack 50 includes the fabric units 18 in a vertical orientation whereas the cassettes 12 are in a horizontal orientation.

In the example of FIG. 5, the hardware platform 10D includes an interface rack 52 supporting 403 Tb/s, e.g., 20× packet units 14 and 8× universal units 16, and an interface rack 54 with 12× universal units 16. The fabric rack 50 includes 9 fabric units 18 and 14 cassettes 12. The cassettes include connections 56 between the racks 50, 52, 54.

The connectivity is via passive Twinax cassettes each with 384 Twinax links (38.4 Tbps). Due to the low insertion loss of Twinax, no repeaters or addition fabric devices are required. Compared with AOC cables, the Twinax cassettes 12 are roughly 10× less expensive. The cassettes 12 also mate many more links simultaneously and thus reduce operational installation and complexity relative to AOC cables.

Scaling

A hardware platform 10 instance has massive scale flexibility. Starting at 14.4 Tb/s, the hardware platform 10 can scale beyond 800 Tb/s+, through the addition of the appropriate number of unit 14, 16, 18 instances. A unique property of this approach is that each system size is given the number of fabric units 18 that it needs (e.g., 3, 4, or 12 switch modules per system). There is no minimum number of fabric units 18. One can go all the way down to zero fabric units 18 and realize a very cost-effective and compact direct-mesh 14.4 T fabric-less small system. Or have a greater number of fabric units 18 for larger systems even extending to multiple racks. Within a single market or application, each system size is differentiated only by the passive components. This simplifies the overall design, enhances Service provider's Total Cost of Ownership and reduces time to market.

The hardware platform can scale in 3 different dimensions, namely interface capacity, fabric capacity, and control plane capacity.

For interface capacity, adding additional packet unit 14 or universal unit 16 instances to a frame, additional interface/forwarding capacity is added. The packet units 14 are 1RU and can be based on 2xJericho3, 36xQSFP400 faceplate (14.4 T), x86+ FPGA accelerator for local control, and OAM. Adding additional packet unit 14 or universal unit 16 instances provides the addition of interface/forwarding capacity in increments of 14.4 Tb/s×28 (28 packet unit 14 instances would be supported in a single rack) to 403 Tb/s initially and expandable to 800+ Tb/s with a multi-rack solution. The resulting port capacity would be:

| Port Type | Single Rack Platform | Multi-Rack Platform |
|---|---|---|
| 100GE ports | 4032 | 8064 |
| 200GE ports | 2018 | 4032 |
| 400GE ports | 1008 | 2016 |

For fabric capacity, adding additional fabric unit 18 instances to a frame, the overall switching capacity of the system is increased. The fabric units 18 (1.25RU) can be based on 2xRamon3. Connecting the fabric unit 18 instances within a rack is done through a set of passive, Twinax-based cassettes 12 which reside behind the fabric unit 18. Twinax has 0.2 dB/inch insertion loss relative to 1.0 dB/in for a reasonably high-end PCB material like Meg7N+. So Twinax can have lengths 5× longer than non-exotic PCB material, which enables larger system sizes. Note: the larger the system, the deeper the backplane becomes.

For control plane capacity, the control plane capacity of a hardware platform 10 can be increased in-service by replacing the current control unit 20 instance with a higher capacity instance. This can utilize an x86 on the control and timing module 30 to enable the higher scale required in 800 T+ systems. Local shelf management can be via a 25GE out-of-band control plane. The server unit 22 can also be used to offload functions.

The dynamic scaling of the hardware platform 10 is meant to allow for the same capacity scalability as is offered by traditional "Leaf & Spine" architectures, but without the operational complexity associated with fiber management; the need to dedicate a significant amount of leaf, and spine capacity associated with inter-system interconnect; and the added cost of the optical modules associated with inter-system interconnect.

For multiple racks, the control units 20 in different racks can connect one another via a faceplate optical ring.

Decoupled Control and Data Plane

The control unit 20 is a distinct component of the hardware platform 10 and is not built to reside within the system. The control unit 20 can execute an external control plane. For larger systems, the control unit 20 could be installed in a separate rack(s) from the fabric unit 18/packet unit 14 elements. Unlike traditional switch/routers, the control unit 20 design is not limited by the constraints of the overall chassis system. As it is completely decoupled, the control unit 20 can scale completely independently from the switching/forwarding elements in the system. When/if additional control plane capacity is required, an updated control unit 20 can be installed in the system.

Environmental and Power Design

The physical architecture of the hardware platform 10 can provide direct front-to-back airflow as the fans 34 are located at the rear of the system. The fans 34 are located behind the Twinax cassette 12 allowing true front-to-back airflow. In this design, the units 14, 16, 18, 20 elements are placed individually in a rack, and not stacked one behind the other. This eliminates scenarios where the air traversing the fabric unit 18 is pre-heated by the forward placed modules (e.g., as in traditional ortho-direct systems).

The hardware platform 10 uses front-to-back airflow, with fans covering almost the entire rear of the system. Since the fan size is decoupled from the unit 14, 16, 18, 20 slot pitches, larger fans can be employed that lower acoustic noise levels relative to smaller fans. The 2RU dual-rotor fan modules 34 offer a good balance between airflow efficiency, noise, and the ability to be a common module with small systems too. Compared with larger fans, the 2RU fans also reduce the size of the airflow short-circuit introduced when a fan module is replaced.

The hardware platform 10 is front access for everything except power and fans, so units 14, 16, 18, 20 do not preheat each other. This enables a good thermal margin.

With front-to-back airflow, the fans 34 are in the rear, so some amount of rear access may be required. The hardware platform 10 also includes the power modules 24 in the rear to simplify power cabling and to maximize the faceplate area available for client interfaces. However, everything else (including the fabric units 18, packet units 14, control modules 20, etc.) are in the front.

In an embodiment, all of the units 14, 16, 18, 20, 22 of the hardware platform 10 are air-cooled with the rear-mounted fans 34. Airflow is direct from front-to-back without "turning" the air. All of the units 14, 16, 18, 20, 22 can have faceplate perforations for intake air. The air passes through the front optical modules, midplane openings, and then through rear-mounted fans. In an embodiment, the maximum heat dissipation is ~2 kW per RU of rack space for switching gear. For large systems, the use of a liquid chilled rear door may be used to transfer heat generated by the air-cooled system to water for removal from the building. The use of the chilled rear door reduces or eliminates the load on Air-Conditioning Units.

With newer networking gear being designed with airflow directly front-to-back and air intake through faceplate perforations around optical module cages, air filters may be required to be placed in a door or cover over the front of the chassis. The space between the front of the shelf and the door must be enclosed at the top and bottom of the system to prevent system intake air from bypassing the air filter in the door. On the left and right side, brushes may be used that allow the fiber cables to pass through behind the door, at the same time blocking air from passing.

Liquid cooling comes in two basic forms—1) cold plates with hoses with cooling liquid running through them or 2) immersion liquid. In the case of cold plates with hoses, this technology is used in high-performance computers. The pumped fluid does not come into direct contact with electronic or optical components and remains in the cooling loop. In the immersion case, dielectric fluid is in direct contact with the electronics and must be sealed from the optical components while providing heat transfer. Immersion cooling is used in data center compute systems using a bath where the gear is submerged from the top. There are emerging technologies that allow immersion module-level cooling for use in traditional rack systems. For use in carrier-grade networking gear, both solutions require fluid to be pumped with dual, replaceable high-quality pumps.

The introduction of liquid cooling into switching gear requires acceptance by operators as it impacts the office environment where the equipment is deployed. CDUs (cooling distribution units) must be deployed along with the installation of delivery and return lines to equipment racks. Some operators are already deploying these structures for use on cabinet rear chilled doors to neutralize the increase in exhaust air temperatures in high power air-cooled equipment. The use of chilled rear doors solves the problem of keeping control of office air temperatures but provides no direct benefit for the cooling of the equipment. The use of chilled rear doors provides an adequate solution for rack densities to 50 kW. Liquid cooling of the equipment moves the liquid delivery lines from the chilled rear door, directly to the equipment, further increasing cooling operation efficiency by eliminating air from the cooling equation.

In the case where the equipment becomes liquid-cooled, but the office does not supply liquid cooling to the rack, the solution is to use liquid to air exchangers that transfer the heat removed from the gear in liquid back to the room air. This solution requires more space, is much less efficient than the CDU solution and does not manage room air temperature.

The hardware platform 10 can include the inclusion of liquid cooling into its next-generation switching gear products. The first use of liquid cooling will likely be in the form of a hybrid system using cold plates and hoses for liquid cooling the higher power components while still using air for some percentage of lower power components in the system. The use of liquid cooling where the air is eliminated from the cooling design has the benefit of dramatically improving Power Usage Effectiveness (PUE) over an air-cooled system. The energy used to operate a liquid cooling system is much lower than that of system fan power combined with required air conditioning in the customer premises. There is also power savings and an increase in reliability of the networking gear by keeping the electronics at a constant and lower temperature versus the ambient operating temperature. Liquid cooling is the future of networking gear.

There are three main factors to motivate moving from forced air cooling to liquid cooling, namely 1) equipment vendor maximizing bandwidth density in less space;

2) operators not able to manage the temperature of the room due to rack power density; and 3) Interest in improving operating efficiency—improving PUE.

To date, the physical size of network switching gear products has been driven by the faceplate space required for the IO and the module space required to house the electronics. Power density has allowed forced air to adequately cool these systems with the space available for heat sinks to transfer the heat from the electronics to the air. As systems have grown in capacity, the Watts per Gigabit ratio continues to drop with each technology node at the cost of higher power density. In the next several years, power densities will be reached where the space available for heat sinks will not be adequate to transfer heat from the electronics. The choice is to remain air-cooled with larger heatsinks and therefore, the size of the system will then be driven by air-cooled capability or to move to more efficient means of cooling, liquid cooling, to continue to have required 10 space drive the physical size of systems.

Ortho-Direct Chassis Approach

FIGS. 6A-6D are block diagrams of an ortho-direct approach for a chassis 60, for comparison with the hardware platform 10. The chassis 60 includes fabric modules 62 that are vertically oriented, to connect to the horizontally oriented units 14, 16, 20. A fundamental issue with ortho-direct fabric modules 62 is that they become unwieldy to install and replace as system size grows past a certain point. For example, the unwieldy point can be around 36"-tall (20RU) for fabric modules 62. That height limit can accommodate 20 packet units 14 (1 RU and 14.4 T each). So, the maximum system size is 288 Tb/s. For a packet-only system, this might be reasonable in many applications.

However, if integrated lines are desired, this requires a mix of packet units 14 and universal units 16, which reduces density due to the 20RU height limit imposed by the fabric modules 62. For example, with 5 universal units 16 (3RU and 14.4 T each) and 5 packet units 14 (1 RU and 14.4 T each), the maximum system size drops from 288 Tb/s to 144 Tb/s (72 Tb/s client+72 Tb/s line).

Alternatively, the ortho-direct system can be populated only with packet units 14 (20 total), and half of them can connect to external DWDM systems via AOC 400G cables. This results in 144 Tb/s client+144 Tb/s Line but requires the cost and fiber management of 360 AOC 400G cables along with extra rack space for the external DWDM systems.

Figure 7A:
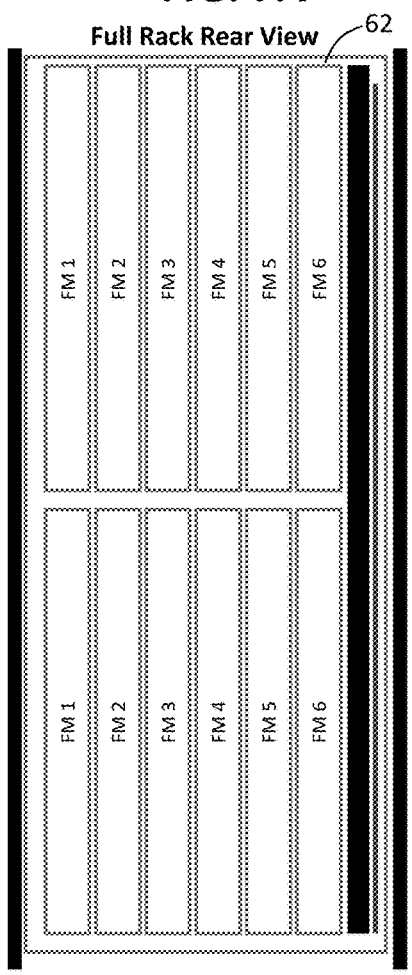
FIGS. 7A and 7B are block diagrams of an ortho-direct approach for a chassis with fabric module couplers for expansion.
Figure 7B:
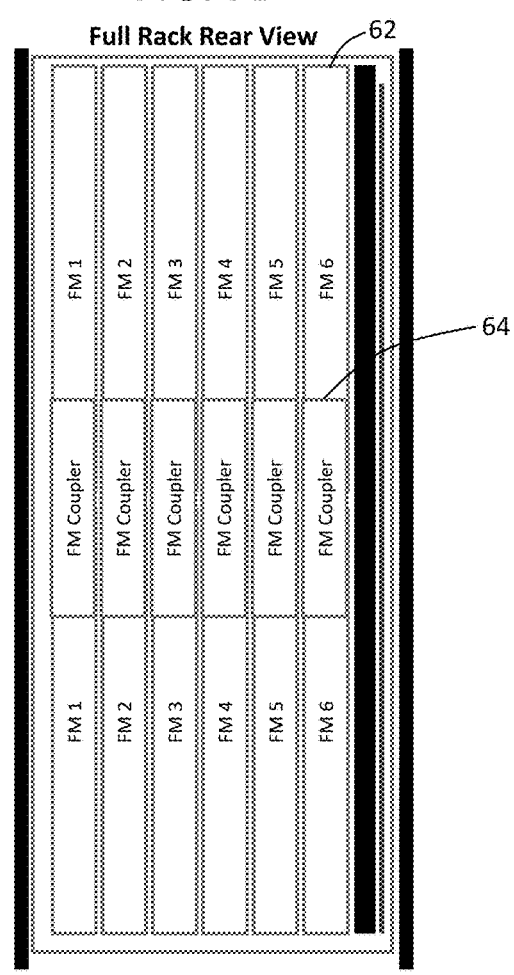

To break through the maximum system size imposed by unwieldy fabric modules 62, multiple small fabric modules 62 can be joined with fabric module couplers 64, as illustrated in FIGS. 7A and 7B. This adds installation complexity, lowers expansion granularity, increases depth, and worsens signal integrity.

FIG. 8 is a table illustrating different approaches for networking hardware to compare the hardware platform 10 with the chassis 60 and pizza boxes. As seen in this table, the hardware platform 10 achieves a better set of trade-offs (relative to the chassis 60 and pizza boxes) that enables a larger maximum size, front access, easier cable management, shallower depth, higher ambient temperature operation, allows different numbers of fabrics in different sizes, and uses the same equipment across many sizes.

Of particular note, the hardware platform 10 is designed so that all units 14, 16, 18, 20 occupy their own space vertically. That is, none of the units 14, 16, 18, 20 are parallel to one another in the vertical direction, and thus, all airflow (either front-to-back or side-to-side) is efficient. The chassis 60, on the other hand, has the fabric modules 62 behind the packet units. Here, the air cooling is such that the fabric modules 62 receive heated air, i.e., that has already flowed over the packet units.

High Availability and Redundancy Options

Figure 9:
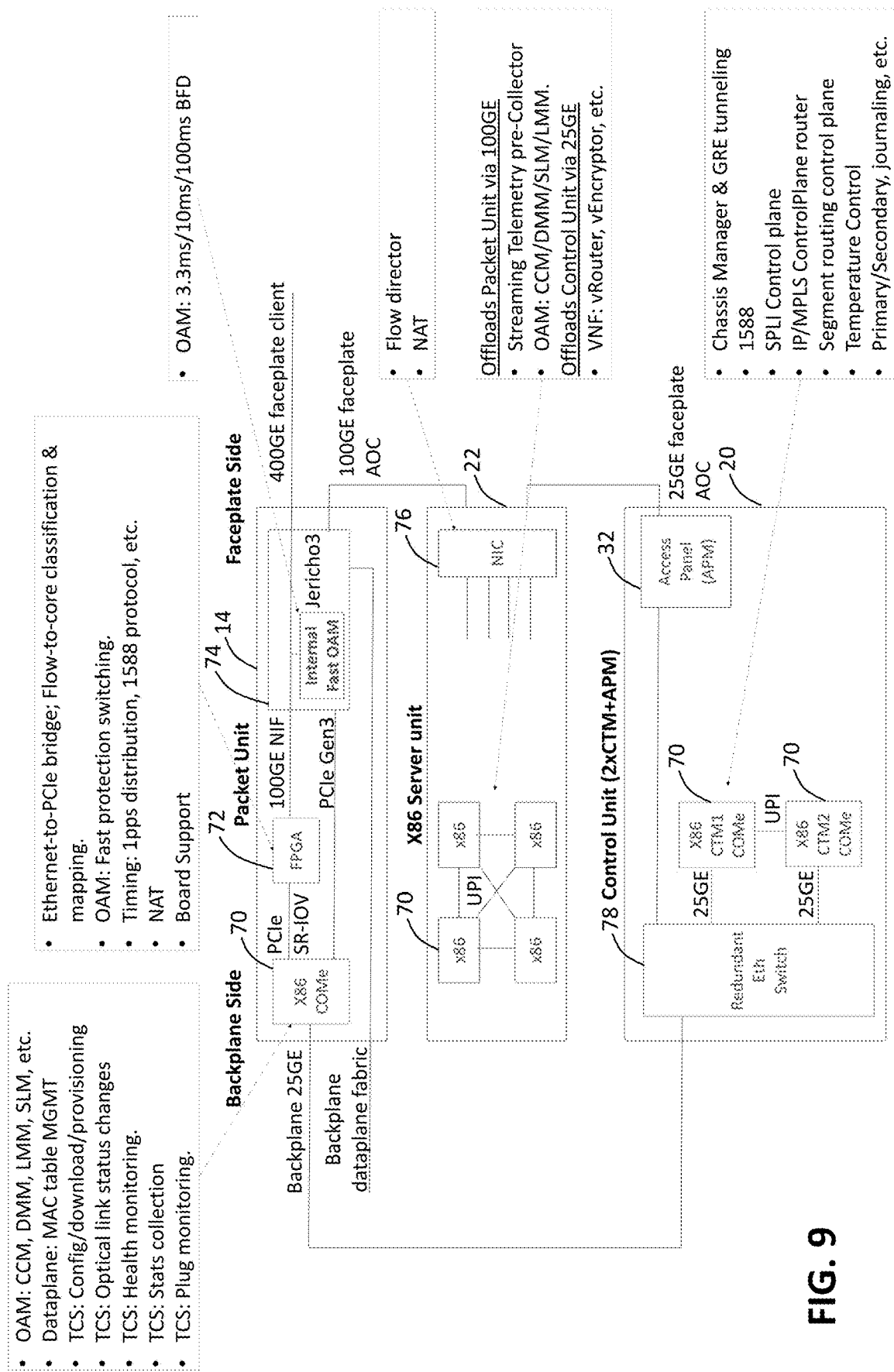
FIG. 9 is a block diagram of a packet unit, a server unit, and a control unit for describing a control plane and OAM plane scalability.

Historically, traditional systems have tied the control plane, data plane, and OAM (management) plane together so that they could not be scaled separately. The hardware platform 10 is designed with separately scalable planes in mind since each plane does not have to grow at the same rate. FIG. 9 is a block diagram of a packet unit 14, a server unit 22, and a control unit 20 for describing control plane and OAM plane scalability. The packet unit 14 an x86 processor 70, an FPGA 72, and an Ethernet switch circuit 74 (e.g., a Jericho3). The server unit 22 can include one or more x86 processors 70 and a Network Interface Card (NIC) 76. The control unit 20 includes one or more x86 processors 70 and the access panel 32 connected to an Ethernet switch 78. Unit interconnectivity can be via the backplane cassette 12 between the packet unit 14 and the control unit 20, and via faceplate AOC between each of the units 14, 22, 20.

In order to make each plane separately scalable, the hardware platform 10 supports an N+1 load-sharing architecture. So the control units 20 can be N+1 in the future as protocols develop that can be spread across multiple CPUs. And x86 servers can be added to scale parts of the OAM plane, such as via the server unit 22.

Power Distribution

Again, the power density of networking hardware is continuously increasing with bandwidth. Over the next several generations, large networking systems that take up a rack will grow in power from 20 kW per rack to 50-100 kW per rack. At these levels, it is not sensible to use traditional 48 VDC office feeds to supply power to this high equipment. Overall, too much supply current is required, impacting the size and number of delivery feeds to the equipment as well as impacting the size of conductors, protection devices, and front-end power circuits within the system being powered. A 100,000 W system requires 2500 A of current at 40 VDC. A standard has been developed to solve this problem using 380 VDC (+/−190 VDC) which drops the current to 1/10 that required in 48 VDC systems.

In order to improve the operational efficiency of power delivery, not only does the input and system internal voltages used for power delivery need to be increased, a reduction in the number of power conversions between the power grid and the equipment should be made. Every power conversion is a penalty in terms of power to perform the conversion and the monetary cost of purchasing the equipment. For example, conversion from 480 VAC three-phase directly to 380 VDC external to the equipment would be more efficient than an additional step to 240 VAC single phase first. 120 VAC just like 48 VDC, is not a practical power voltage for large systems. Delivering the highest voltage possible as close as possible to the equipment inputs, reduces IR drop and the size of copper conductors used to carry the current. Inside the switching gear, 380 VDC is converted to 48V or 12V on the individual modules that is then converted to various voltages from 0.8V to 3.3V to directly power the electronics.

In an embodiment, the hardware platform 10 uses substantially 380 VDC to distribute power within the system. Using N+1 load-sharing power modules 24, the hardware platform 10 supports numerous office feed voltages with the use of different power module 24 models including 48 VDC, 380 VDC, 240 VDC/240 VAC, 480 VAC. The power modules 24 convert these office voltages to 380 VDC for distribution to the loads in the hardware platform 10.

In an embodiment, the power modules 24 are N+1 protected (1 protection power module 24 for N working power modules 24, N is an integer greater than or equal to 1). Each power module 24 can include two input feeds (e.g., A and B feeds), and each power module 24 can perform load sharing to provide an output feed (e.g., a C feed). There can be two output feeds in each housing, e.g., a C1 feed for a working zone and a C2 feed for a protection zone.

The power modules 24 can be inserted in the housing at any position and mate with the appropriate busbars and bused backplane. Multiple power modules 24 can load share into one housing. The power modules 24 can be mounted outside the housing and attached directly to the rack.

The control unit 20 can detect that communications are lost to a power module 24 because it can see that the unit powered by that power module 24 is up.

Switching Architecture

Figure 10:
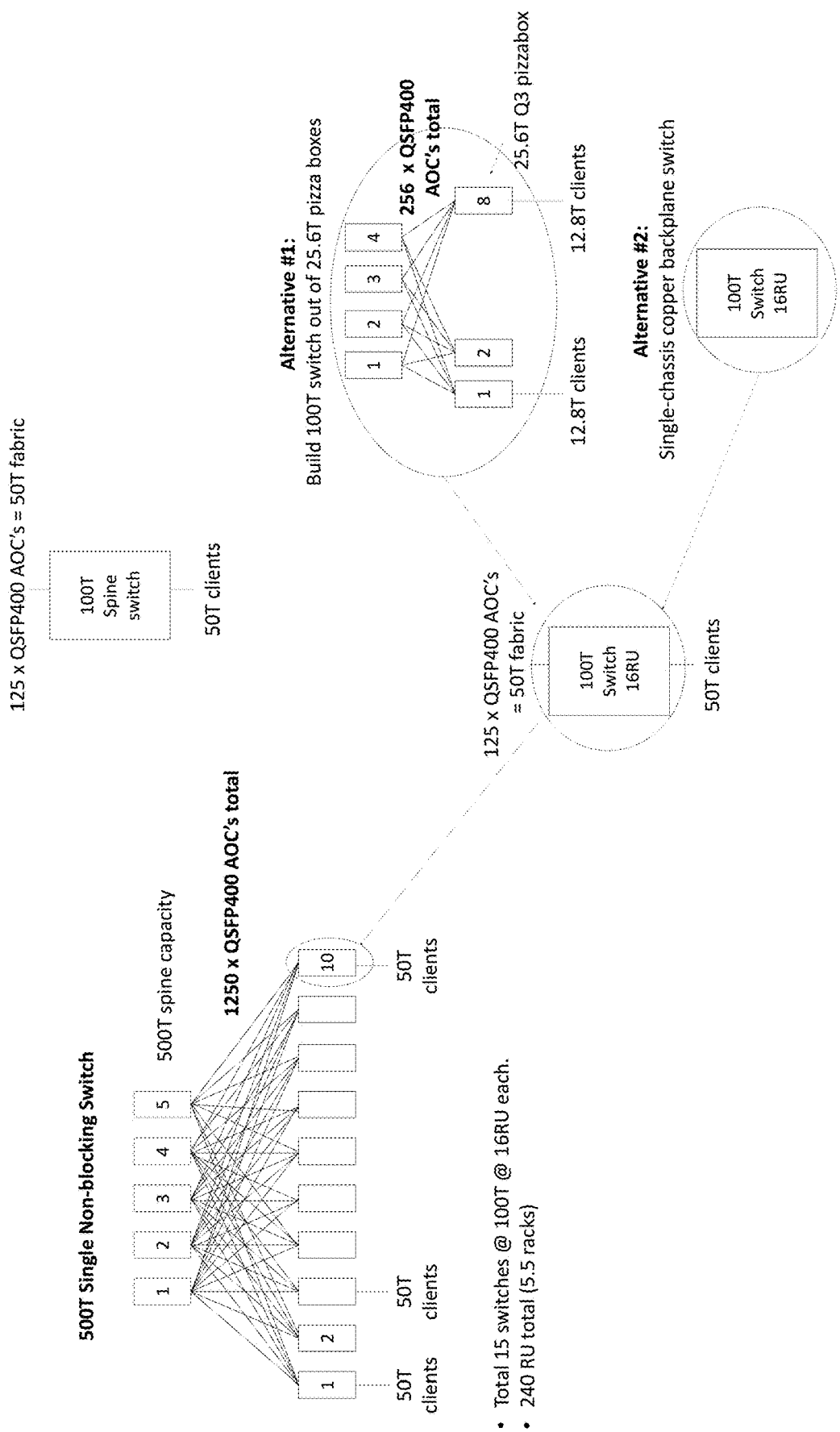
FIG. 10 is a diagram illustrating a leaf-spine architecture.
Figure 11:
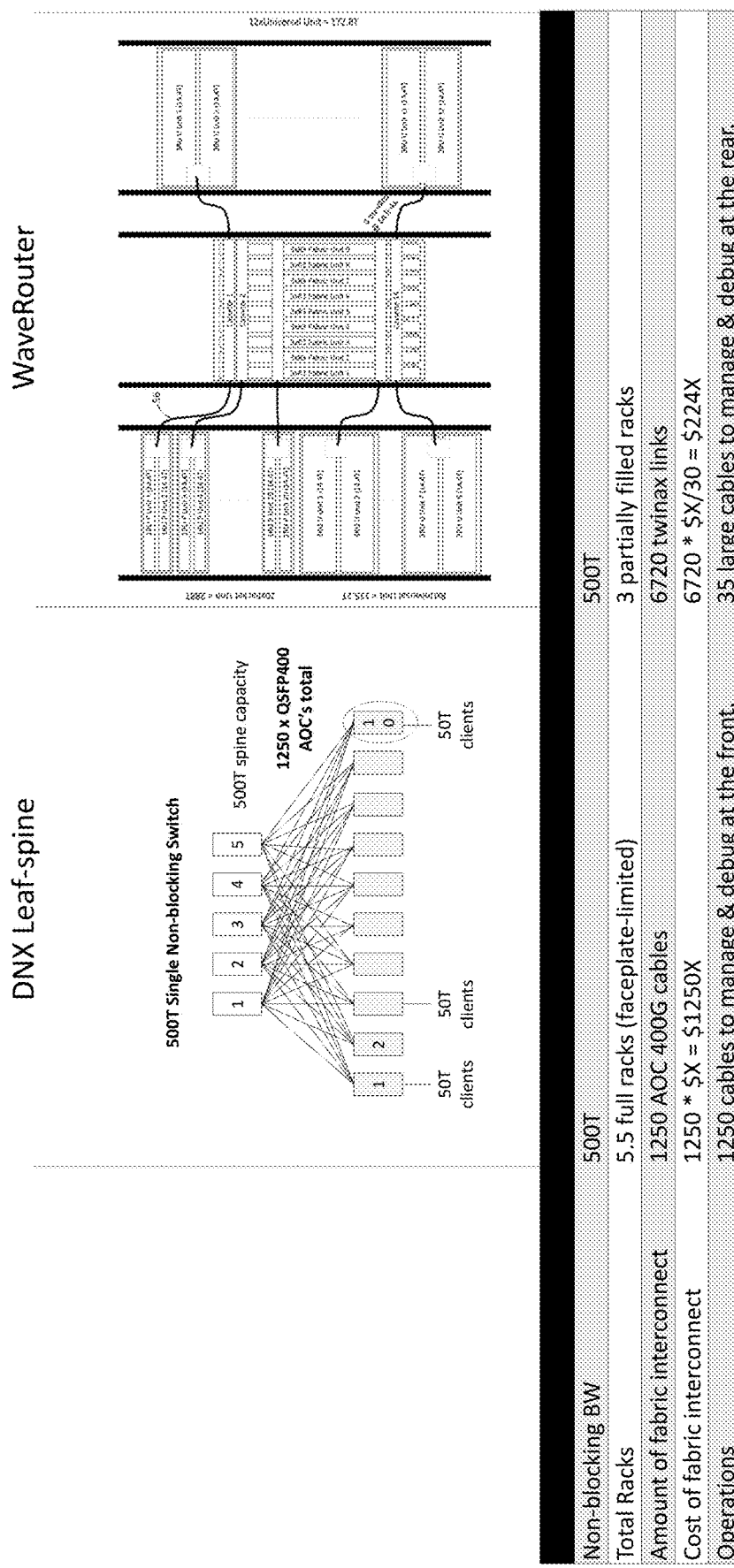
FIG. 11 is a diagram comparing the hardware platform to the leaf-spine architecture.

FIG. 10 is a diagram illustrating a leaf-spine architecture. FIG. 11 is a diagram comparing the hardware platform 10 to the leaf-spine architecture. There are tradeoffs between a switching architecture that that uses a single chassis versus distributed switching hardware (e.g., leaf-spine). Compared to leaf-spine, typical chassis bandwidth is limited by the physical size of a single rack—either rack height or depth or both. A leaf-spine architecture is naturally multi-rack capable since it is interconnected with AOC cables. This means that only the cost of cabling, installation complexity of AOC cabling, and switch device radix are limited to its maximum system size. Growing beyond 800 Tn/s+ should not be a problem with leaf-spine.

Leaf-spine pizza boxes have a better chance of being air-cooled at 50 deg. C. since they can be made whatever height is necessary to achieve this. And since they are not limited to a single rack, the extra height does not decrease maximum system size as it does with the other single-rack options.

In terms of comparing the hardware platform 10 to leaf-spine pizza boxes, leaf-spine pizza boxes can more easily fit in 600 mm depth if needed (not including cabling room). However, leaf-spine pizza boxes consume more rack units. To achieve an 800 Tb/s+ node built from 15 nodes of 100 Tb/s each (see FIG. 10), this would consume 5.5 racks. Leaf-spine pizza boxes can be in a variable-pitch system, e.g., that allows 1RU, 2RU, and 3RU pizza boxes to be mixed together as part of a single switch. Unlike fixed-slot-pitch chassis-based systems, a given pizza box can be designed for whatever height is necessary for cooling, power, and type of client ports, whereas shelf-based systems require fixed-pitch modules to match the fixed-pitch backplane.

One trade-off in a leaf-spine is that the faceplate is used for fabric connectivity (via AOC's), so it reduces faceplate density available for client ports. However, this reduction in density does not limit max system size since the pizza boxes can sprawl across racks easily. Leaf-spine maximum size can be limited by switch radix, but this limit happens well above 800 Tb/s+. Also, if many leaf-spine pizza boxes are controlled via SDN, control plane scalability can become an issue.

The existential disadvantage of leaf-spine systems is the cost of the fabric interconnect via AOC's. For an 800 Tb/s+ non-blocking system, this can be 1250 individual AOC400G cables or more for a non-blocking system constructed from fifteen 100 Tb/s chassis. If 25.6 Tb/s pizza boxes were used, the number of cables increases to 3810 AOC's. The cost of the AOC's can be reduced with Twinax QSFP400 DAC cables, but this introduces more stiffness, larger bend radius, and more bulk leading to greater difficulty in slack management.

At some point, system size is larger than chassis-based systems, and leaf-spine is the only way to scale. For these large systems, it can be advantageous to build them up from larger hardware platform 10 nodes. This replaces a lot of the AOC cables with more cost-effective and operationally simpler cassettes 12. It also improves control plane scalability by reducing the number of unique management points in the network.

As illustrated in FIGS. 10-11, although the leaf-spine architecture solves many constraints required by chassis-based systems, the cabling cost and operational complexity are prohibitive for 800 Tb/s+ non-blocking systems, unlike the hardware platform 10.

The dynamic scaling (in 3 different dimensions) of the hardware platform 10 allows for the same capacity scalability as is offered by the leaf-spin architectures, but without the operational complexity associated with fiber management; the need to dedicate a significant amount of leaf, and spine capacity associated with inter-system interconnect; and the added cost of the optical modules associated with inter-system interconnect.

Interface Support

The hardware platform 10 supports various interfaces, e.g., pluggable modules. For example, the packet unit 14 can support 36xQSFPDD/QSFP28 interfaces providing support for 100GE, 200GE, and 400GE client interfaces with the appropriate Ethernet FEC via QSFP28 QSFP56, QSFP-DD, etc. Additional client support can be via a universal unit 16 utilizing up to 12 USSMs 26 where each module is purpose-built for enhanced capabilities such as FlexO (FOIC), OTU4, 10GE/40GE.

Hardware Platform Scale

Figure 12:
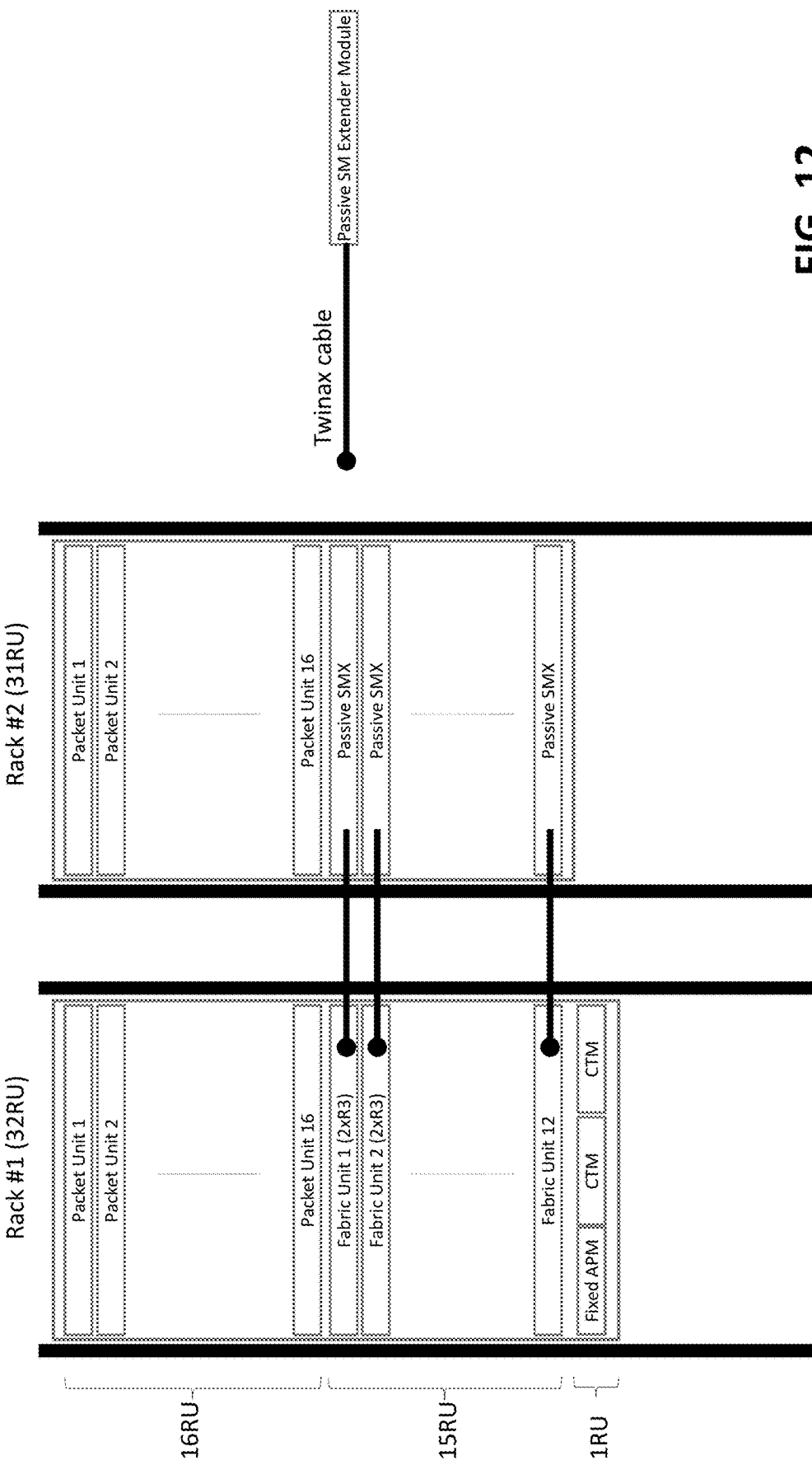
FIG. 12 is a diagram of a hardware platform illustrating multi-rack expansion.

FIG. 12 is a diagram of a hardware platform 10E illustrating multi-rack expansion. Again, the hardware platform 10 is multi-rack back-to-back capable, so scale is not limited by a single rack. This back-to-back approach in the hardware platform 10E uses Twinax so it is less expensive than optical interconnects. It also uses passive modules, so no extra cost for repeaters. Whether in a single rack or two racks, the hardware platform 10E effectively operates as a single switching node managed by the same control unit 20. That is, regardless of the number of units 14, 16, 18, 20, 22 and the number of racks, the hardware platform 10 is a single network element from a control plane and network management perspective.

Fabric and Network Circuitry

In an embodiment, the hardware platform 10 can utilize the Broadcom DNX family of hardware to implement data path traffic forwarding and management and uses the Fabric Access Processor ASIC (FAP) to perform all packet processing functions and a Fabric Element (FE) ASIC to connect all packet unit 10 elements together. The Fabric Access Processor (FAP) provides the following functions:

1) Flexible packet classification using a programmable microcode engine with built-in support for data center and carrier networking applications. The system contains large on-chip classification databases which can be extended using an external knowledge-based processor.

2) Traffic manager with deep packet buffers. The implementation distributed scheduling scheme that allows state-of-the-art hierarchical quality-of-service (QoS), transmission scheduling per-customer, per-service, as well as tunneling and overlay networks. Flexible flow control mechanisms support Priority-based Flow Control (PFC), Enhanced Transmission Selection (ETS), Explicit Congestion Notification (ECN).

The FE provides the following capabilities:

1) Switching function between the FAP and provides a complete solution for switching fabric, traffic management, packet processing, and network interfaces.

2) Scalability is provided in three dimensions, which allows the user to connect mixed-rate line cards: Port rates, Port counts, and Traffic management services.

3) A self-routing device with dynamic load balancing.

4) Supports fabric multicast and multicast load balancing.

5) Supports three pipes for traffic allocation of Unicast Data—Multicast Data and priority.

6) The fabric is a cell-based switch.

7) Automatic fault detection.

8) Scheduled device removal and device insertion without cell loss.

9) The system provides fault tolerance by automatically detecting and rerouting around faulty links or elements, resulting in a fault-tolerant self-healing fabric. The system reacts to faults in a device, connection, or configuration.

Packet and OTN Switching Support

The hardware platform 10 supports the capability to transparently map OTN and Ethernet interfaces over a packet service using specialized USSM's 26 within the universal unit 16, for transparent private line services. The USSM's 26 can provide an emulated service that is a packet service providing either bandwidth reservation and admission control or forwarding prioritization and boundary traffic conditioning mechanisms. The network must provide guarantees for low jitter and low loss.

Long Haul Optics

The hardware platform 10 supports the direct integration of high-performance long-haul optics (90+ GBaud) via an external shelf or via the universal unit 16 and USSM's 26.

Cassettes and Hardware Implementation

Figure 13:
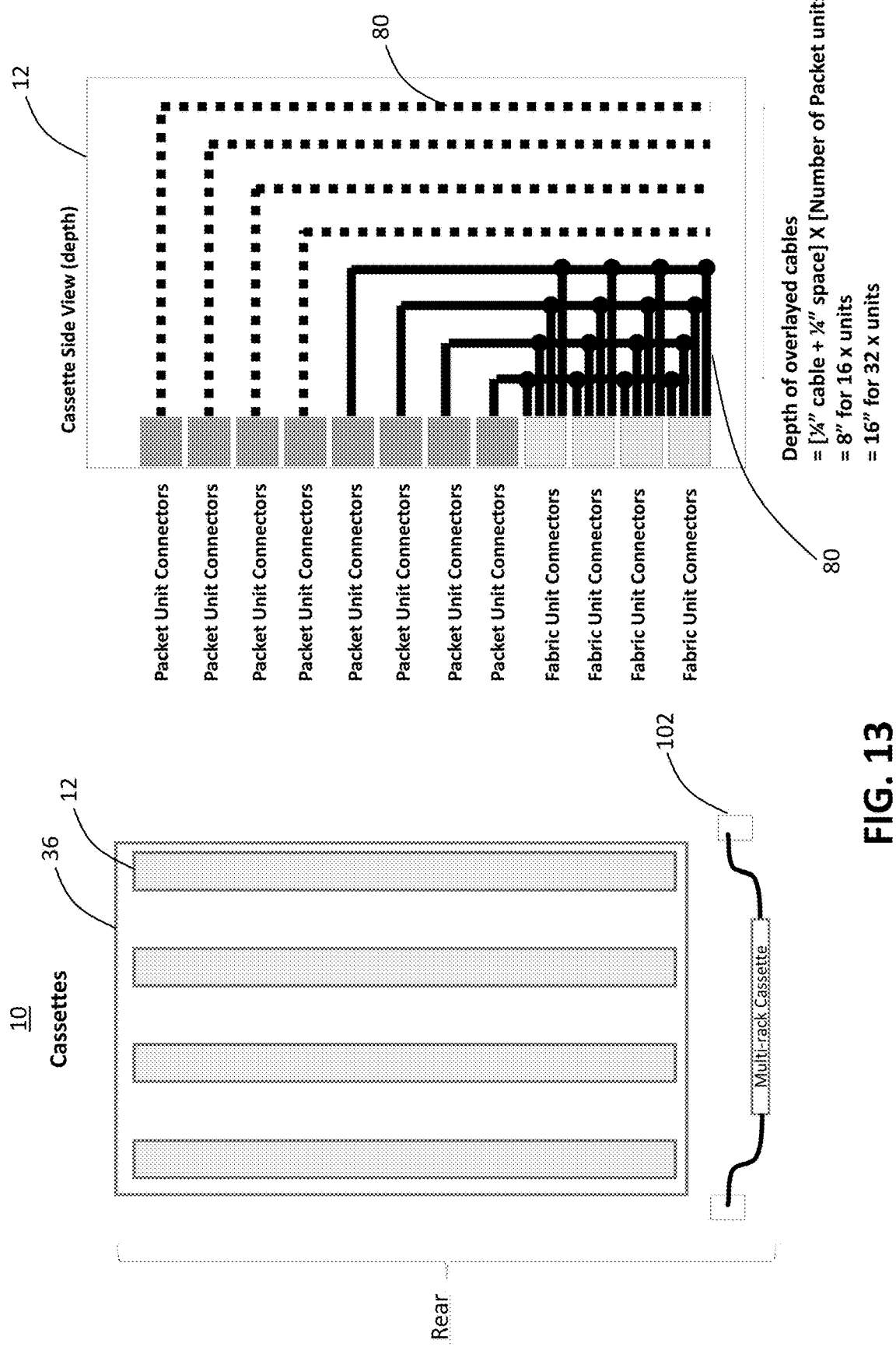
FIG. 13 is a diagram of a rear view and a side view of the cassettes.
Figure 14:
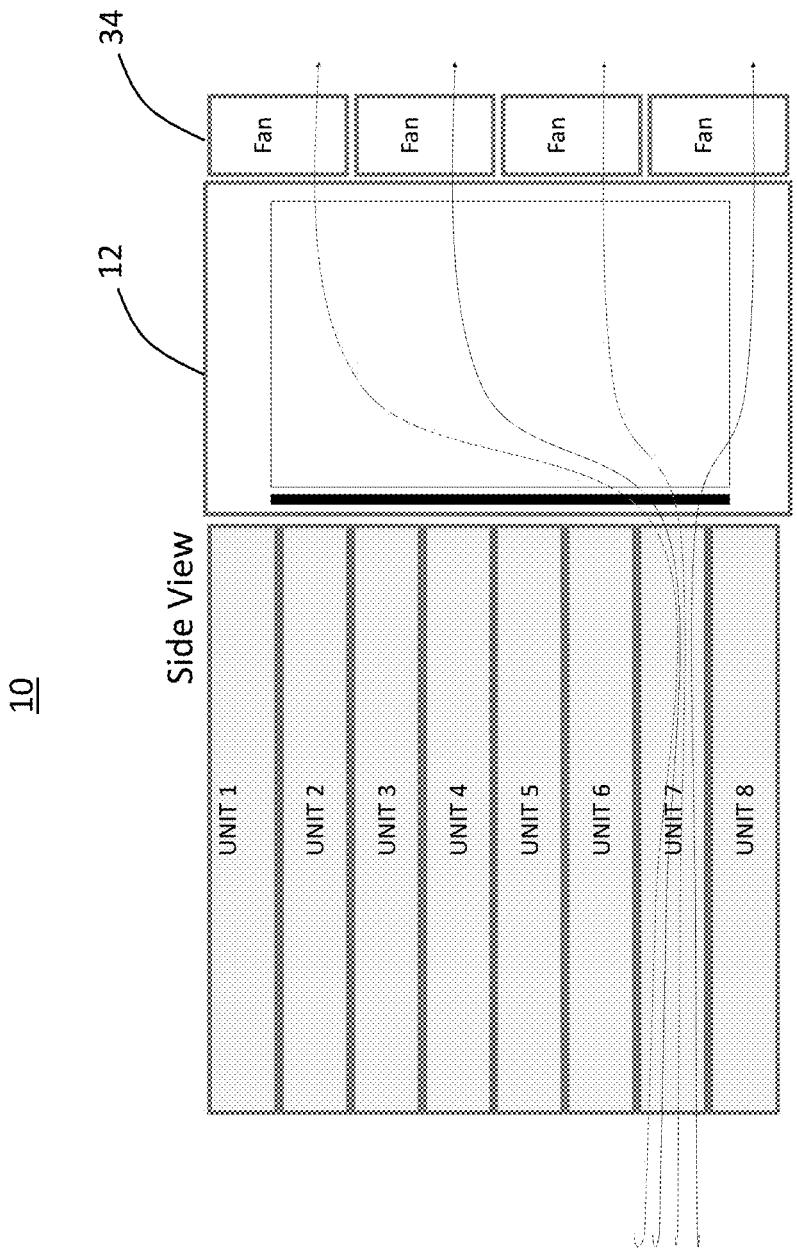
FIG. 14 is a side view of the hardware platform 10 illustrating airflow between the units, the cassettes, and the fans.
Figure 15:
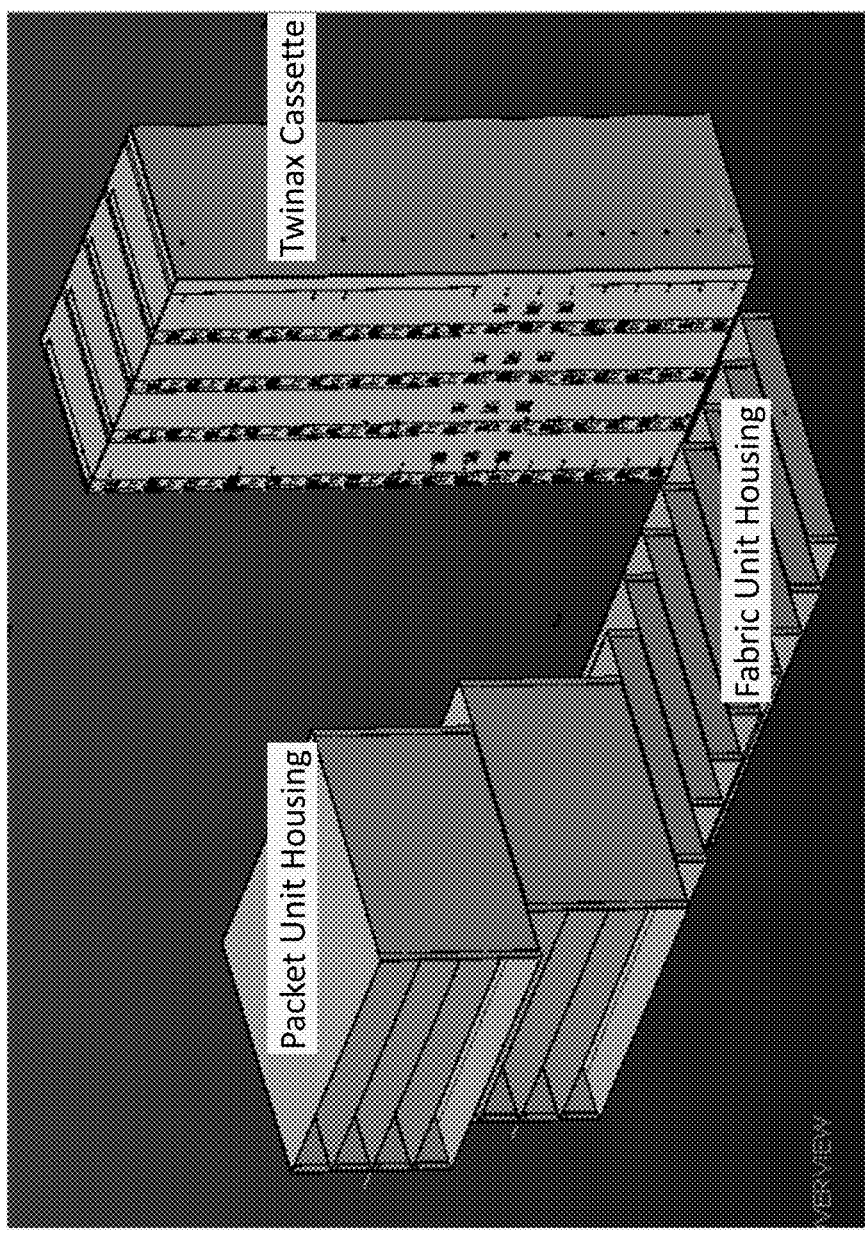
FIG. 15 is a perspective diagram of an implementation of the cassettes and housings for the packet units and the fabric units.
Figure 17:
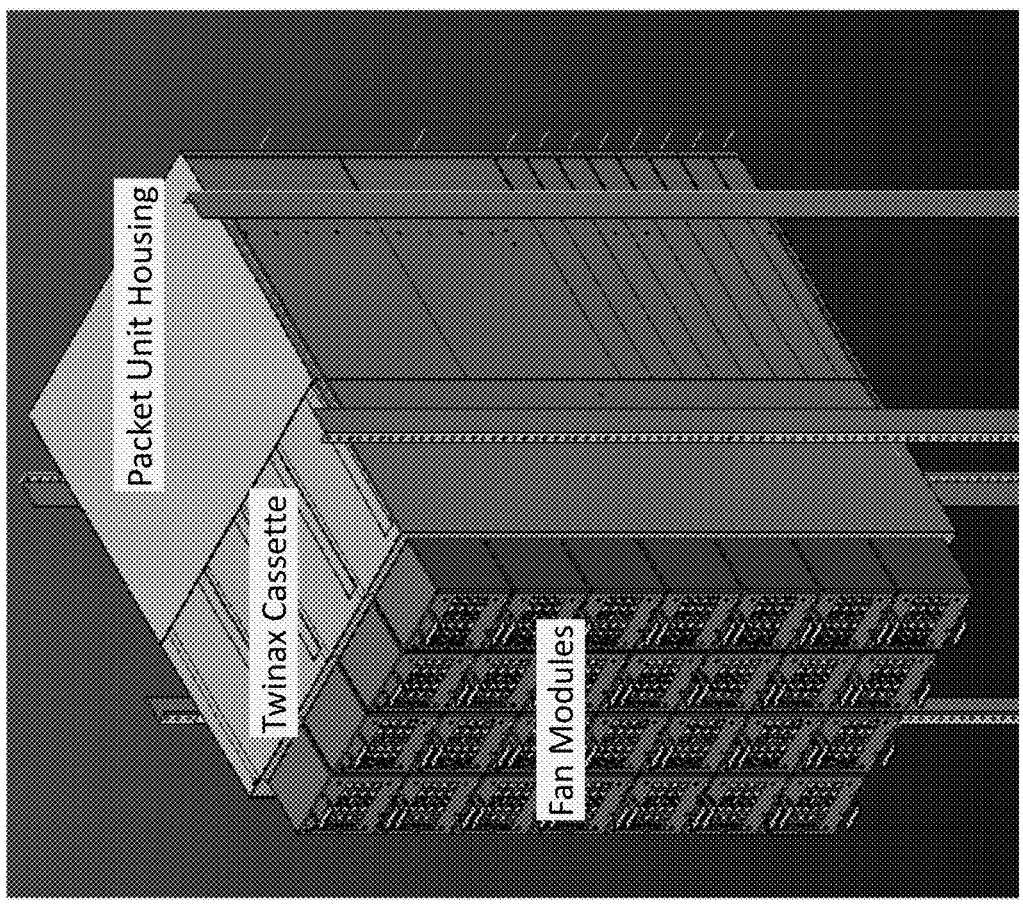
FIG. 17 is a rear perspective diagram of the same hardware platform as FIG. 16.
Figure 16:
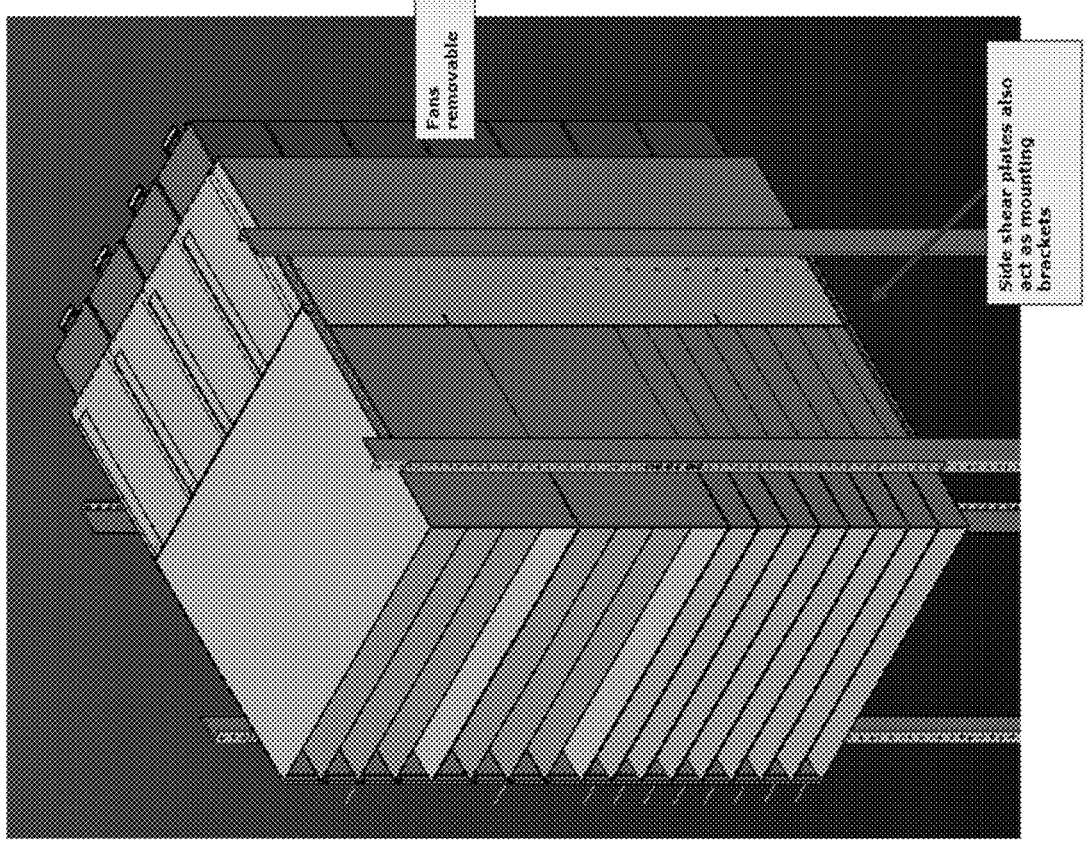
FIG. 16 is a front perspective diagram of the housings connected to the cassettes and mounted in a rack.
Figure 18:
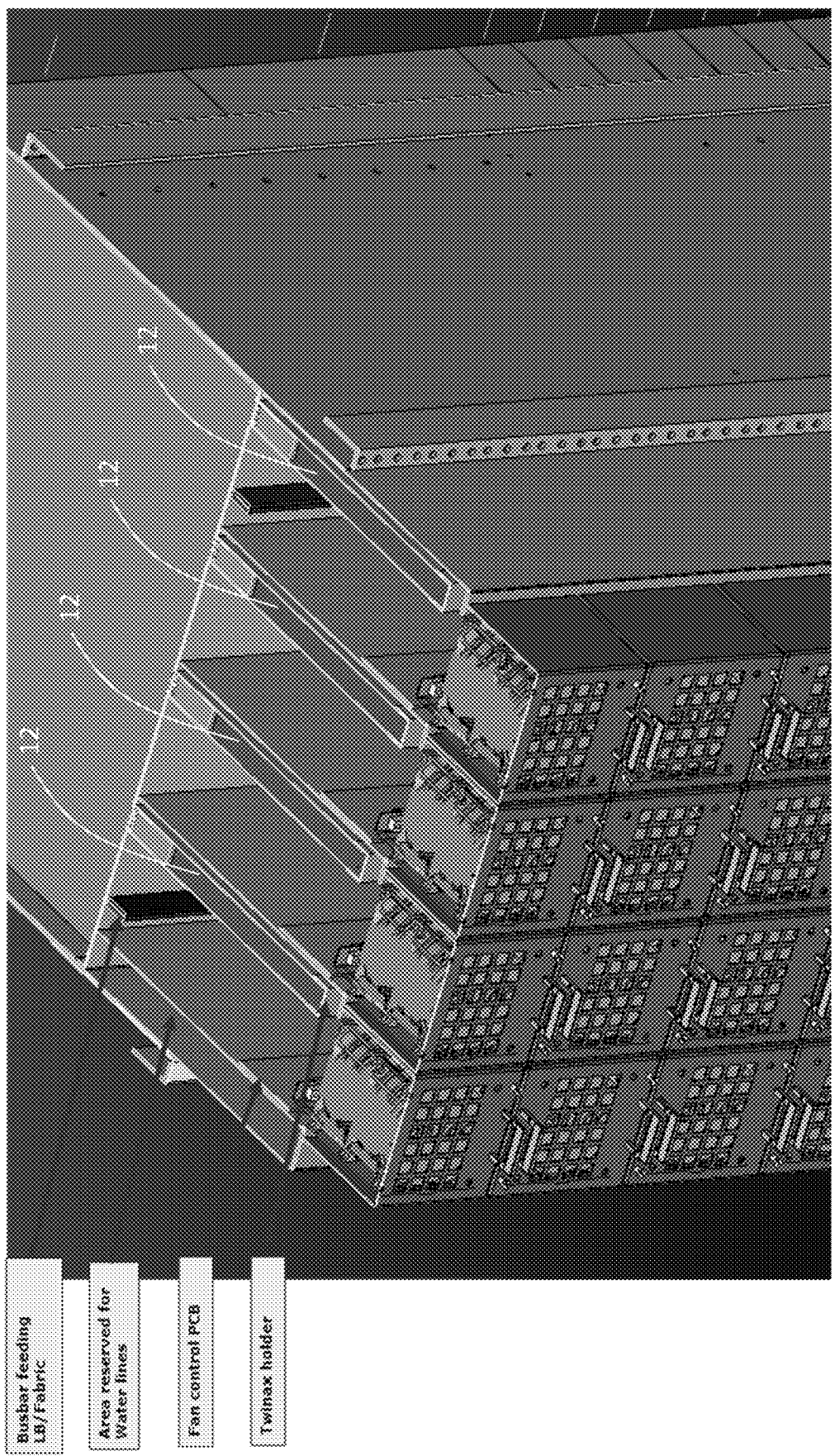
FIG. 18 is a horizontal section view of the same hardware platform as FIG. 17.
Figure 19:
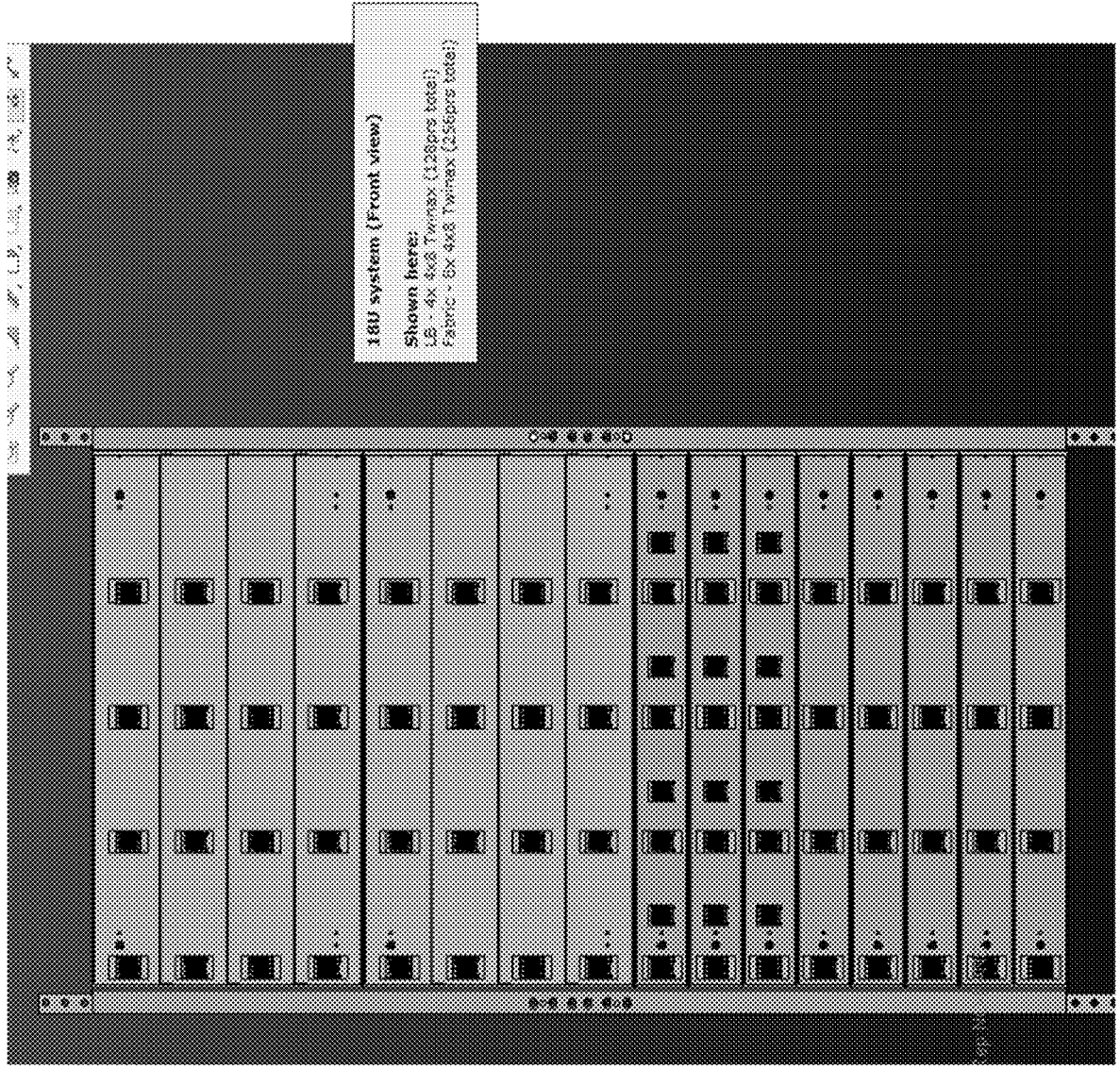
FIG. 19 is a rear view diagram of the housings illustrating the connectors to the cassettes.

FIG. 13 is a diagram of a rear view and a side view of the cassettes 12. FIG. 14 is a side view of the hardware platform 10 illustrating airflow between the units 14, 16, 18, 20, the cassettes 12, and the fans 34. FIG. 15 is a perspective diagram of an implementation of the cassettes 12 and housings for the packet units 14 and the fabric units 18. FIG. 16 is a front perspective diagram of the housings connected to the cassettes and mounted in a rack. FIG. 17 is a rear perspective diagram of the same hardware platform as FIG. 16. FIG. 18 is a horizontal section view of the same hardware platform as FIG. 17. FIG. 19 is a rear view diagram of the housings illustrating the connectors to the cassettes 12.

The cassettes 12 can include a substantially rectangular housing that extends vertically and connects horizontally to the various units 14, 16, 18, 20, 22. In an embodiment, cables 80 inside the cassettes 12 can Twinax copper cables. As illustrated in FIG. 13, the depth of the cassettes 12 are based on how many units 14, 16, 18, 20, 22 are supported vertically. In the side view of FIG. 13, the depth is shown expanding as the number of units increases. This is due to the fact each unit has to be connected to one another via a set of Twinax cables. In an embodiment, the depth is about equal to $$= [1/4'' \text{ cable} + 1/4'' \text{ space}] \times [\text{Number of units}]$$
$$= 8'' \text{ for } 16 \times \text{units}$$
$$= 16'' \text{ for } 32 \times \text{units}$$

Also, the cables 80 can span between adjacent racks to create a single multi-rack switch. The cables 80 delivers data fabric and control signals and can mate to power buses.

In another embodiment, the cables 80 can be optical fiber with MPO/MTP connectors.

For example, in FIG. 18, the sectional view illustrates four cassettes 12, each forming a channel that terminates with the fans 34. The even distribution of cables 80 in the cassette 12 can ensure airflow is confined in each channel.

Of note, the cables 80 are point-to-point connections. That is, each of the units on the right side of FIG. 13 has a corresponding cable 80 connected to each other unit. As such, the more units, the larger the required depth for the cassettes.

FIG. 19 illustrates the back of the housings, where connectors are shown for each unit. The cassettes 12 span vertically and the units 14, 16, 18, 20, 22 connect horizontally to the connectors. For example, in an embodiment, there are four cassettes 12, each having the cables 80, and each spanning the vertical length of a rack. Each unit connects to corresponding connectors on each of the four cassettes 12.

The cassettes 12 mate directly with the units, but also mate directly to the housing for the purpose of reducing the number of physical drops required of the cables 80.

The endpoints of the cassettes 12 (FIG. 19) provide Electromagnetic Interference (EMI) containment of a group of signals. The endpoints can provide mounting, gasketing, power, and control signals for fan modules.

The cassettes 12 can be passive devices generally but may include an IDROM (ID Read Only Memory) for identification purposes.

The housing for the cassettes can include liquid-cooling manifolds and tubing for multiple units.

As described herein, the cassettes 12 include different depths corresponding to different system sizes. The cassettes 12 can be different based on the size/pitch of the units.

Networking Hardware Platform

Referring back to FIGS. 1-19, the present disclosure includes the networking hardware platform 10 which includes a plurality of units 14, 18, 20 each having a first plurality of connectors 44 on a rear side, wherein each of the plurality of units 14, 18, 20 is any of a packet unit 14, a fabric unit 18, and a control unit 20, and wherein collectively the plurality of units 14, 18, 20 are configured to operate as a network element in a network; and a cassette 12 system including one or more units (cassettes 12) each having cabling 80 therein and a second plurality of connectors 42 located along the length to connect to corresponding connectors of the first plurality of connectors 44, wherein the cassette 12 system is configured to connect to a rack (posts 40), wherein an orientation of the one or more units is orthogonal to an orientation of the plurality of units, in the rack, wherein the cabling 80, in each cassette 12, extends between each of the second plurality of connectors 42 for interconnectivity between each corresponding connector along the length of the corresponding cassette 12 (see FIG. 13).

The cables 80 can include a plurality of Twinaxial cables. The networking hardware platform 10 can further include connectors 102 associated with the cassette 12 system configured to connect to corresponding connectors in a second rack, such that the network element includes associated units in the rack and in the second rack. The networking hardware platform 10 can further include a second control unit 20 located in the second rack connected to a first control unit 20 located in the rack. The cables 80 include optical cabling with a multi-fiber connector forming the first plurality of connectors 44 and the second plurality of connectors 42. The networking hardware platform 10 can further include one or more fans 34 disposed at an opposite end of the one or more units 12 from the plurality of units 14, 18, 20. The one or more units 12 can be multiple units that form channels for airflow between the plurality of units 14, 18, 20, and the fans 34 and for electromagnetic interference (EMI) containment. Each of the plurality of units 14, 18, 20 can be in a different horizontal plane from one another and airflow is front-to-back from a faceplate of each horizontally oriented unit 14, 18, 20 to corresponding one or more fans 34.

The cassette 12 can be a passive device and includes a read-only memory for identification thereof. A depth, horizontally, of the one or more units 12 can be based on a number of the plurality of units 14, 18, 20. A pitch of at least two units of the plurality of units 14, 18, 20 is different. The packet units 14 can be configured to support pluggable optical modules. The networking hardware platform can further include at least one universal unit 16 that is similar functionally to the packet unit 14 except for larger pitch and for support of at least one coherent optical module for long haul transmission. The networking hardware platform can further include N+1 power modules 24 located at a rear of the cassettes 12, N is an integer 1, and the +1 is a protection module. The N+1 power modules 24 can provide substantially 380 VDC to the units.

FIG. 20 is a flowchart of a process 120 of installing a networking hardware platform 10. The process 120 includes:

installing a cassette system in a rack, wherein the cassette system includes one or more units each having cabling therein and a first plurality of connectors located along the length, wherein the cabling, in each unit of the cassette system, extends between each of the first plurality of connectors for interconnectivity between each corresponding connector along the length of the corresponding unit of the cassette system (step 122); and connecting a plurality of units to the cassette system, wherein each of the plurality of units has a second plurality of connectors on a rear side configured to connect to corresponding connectors of the first plurality of connectors, wherein an orientation of the plurality of units is orthogonal to an orientation of the one or more units, wherein each of the plurality of units is any of a packet unit, a fabric unit, and a control unit, and wherein collectively the plurality of units are configured to operate as a network element in a network (step 124).

The cables can include a plurality of Twinaxial cables. The process 120 can further include connecting the first plurality of connectors associated with the cassette system to corresponding connectors in a second rack, such that the network element includes associated units in the rack and in the second rack.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A modular hardware platform for networking, computing, and/or storage functions comprising:
    one or more units each having a first plurality of connectors on a rear side, wherein collectively the one or more units are configured to operate as a network element in a network; and
    a cassette system including one or more cassette units each having cabling therein and a second plurality of connectors located along the length to connect to corresponding connectors of the first plurality of connectors, wherein an orientation of the second plurality of connectors is orthogonal to an orientation of the one or more units;
    wherein a dimension of the cassette system is based on a bandwidth of the network element.

2. The modular hardware platform of claim 1, wherein the cabling includes a plurality of Twinaxial cables.

3. The modular hardware platform of claim 1, wherein the network element includes the one or more units in a first rack and one or more units in a second rack, and wherein the second plurality of connectors are further configured to connect to corresponding connectors in the second rack.

4. The modular hardware platform of claim 3, further comprising:
    a second control unit located in the second rack connected to a first control unit located in the first rack.

5. The modular hardware platform of claim 1, wherein the cabling includes optical cabling with a multi-fiber connector forming the first plurality of connectors and the second plurality of connectors.

6. The modular hardware platform of claim 1, further comprising one or more fans disposed at an opposite end of the cassette system from the one or more units.

7. The modular hardware platform of claim 6, wherein the cassette system includes channels for airflow between the one or more units and the fans and for electromagnetic interference (EMI) containment.

8. The modular hardware platform of claim 6, wherein airflow is front-to-back from a faceplate of each unit to corresponding one or more fans.

9. The modular hardware platform of claim 1, wherein the cassette system is a passive device and includes a read-only memory for identification thereof.

10. The modular hardware platform of claim 1, wherein the one or more units include a plurality of units.

11. The modular hardware platform of claim 10, wherein the plurality of units include a packet unit and a control unit.

12. The modular hardware platform of claim 10, wherein the plurality of units include a packet unit, a control unit, and a server unit.

13. The modular hardware platform of claim 1, wherein the one or more units are configured with one or more pluggable optical modules.

14. The modular hardware platform of claim 1, wherein the one or more units include at least one coherent optical module for long haul transmission.

15. The modular hardware platform of claim 1, further comprising N+1 power modules located at a rear of the cassette system, N is an integer ≥1 and the +1 is a protection module.

16. The modular hardware platform of claim 15, wherein the N+1 power modules provide substantially 380 VDC to the units.

17. The modular hardware platform of claim 1, wherein the one or more units support multiple layer functionality including any of Layer 0, Layer 1, Layer 2, and Layer 3.

18. The modular hardware platform of claim 1, wherein the network element is configurable as either a core router or an edge router.

19. A method of installing a modular hardware platform for networking, computing, and/or storage functions comprising steps of:

installing, in a rack, one or more units each having a first plurality of connectors on a rear side, wherein collectively the one or more units are configured to operate as a network element in a network; and installing a cassette system including one or more cassette units each having cabling therein and a second plurality of connectors located along the length to connect to corresponding connectors of the first plurality of connectors, wherein an orientation of the second plurality of connectors is orthogonal to an orientation of the one or more units;

wherein a dimension of the cassette system is based on a bandwidth of the network element.

20. A modular hardware platform for networking, computing, and/or storage functions comprising:

one or more units each having a first plurality of connectors on a rear side, wherein collectively the one or more units are configured to operate as a network element in a network; and a cassette system including one or more cassette units each having cabling therein and a second plurality of connectors located along the length to connect to corresponding connectors of the first plurality of connectors, wherein an orientation of the second plurality of connectors is orthogonal to an orientation of the one or more units;

wherein the cassette system is a passive device and includes a read-only memory for identification thereof.

* * * * *